United States Patent
Tsuda

(10) Patent No.: US 7,994,787 B2
(45) Date of Patent: Aug. 9, 2011

(54) SUPERCONDUCTING MAGNET, MAGNETIC RESONANCE IMAGING APPARATUS, AND METHOD OF CALCULATING COOLABILITY OF CRYO-COOLER

(75) Inventor: Munetaka Tsuda, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 423 days.

(21) Appl. No.: 12/304,950

(22) PCT Filed: Jul. 2, 2007

(86) PCT No.: PCT/JP2007/063225
§ 371 (c)(1),
(2), (4) Date: Dec. 15, 2008

(87) PCT Pub. No.: WO2008/007574
PCT Pub. Date: Jan. 17, 2008

(65) Prior Publication Data
US 2009/0210199 A1    Aug. 20, 2009

(30) Foreign Application Priority Data
Jul. 12, 2006 (JP) .................................. 2006-191705

(51) Int. Cl.
*G01V 3/00* (2006.01)
(52) U.S. Cl. ....................................... 324/318; 324/309
(58) Field of Classification Search .......... 324/300–322; 600/300, 407, 410, 411; 340/539.12
See application file for complete search history.

(56) References Cited

U.S. PATENT DOCUMENTS

| 6,621,413 | B1 | 9/2003 | Roman et al. | |
|---|---|---|---|---|
| 6,708,758 | B2 * | 3/2004 | de Rouffignac et al. | ...... 166/245 |
| 2007/0204630 | A1 * | 9/2007 | Tsuda | ............................ 62/47.1 |
| 2010/0176811 | A1 * | 7/2010 | Tsuda | ........................... 324/318 |

FOREIGN PATENT DOCUMENTS

| JP | 63-232305 | 9/1988 |
|---|---|---|
| JP | 5-172924 | 7/1993 |
| JP | 6-69030 | 3/1994 |
| JP | 8-306971 | 11/1996 |
| JP | 2002-209872 | 7/2002 |

OTHER PUBLICATIONS

CD-ROM of the specification and drawings annexed to the request of Japanese Utility Model Application No. 31721/1991 (Laid-open No. 52160/1994) (Shimadzu Corp.), Jul. 15, 1994.

* cited by examiner

*Primary Examiner* — Brij B Shrivastav
(74) *Attorney, Agent, or Firm* — Cooper & Dunham LLP

(57) ABSTRACT

An MRI apparatus is provided in which a heat quantity penetrating into the helium tank of a superconducting magnet can be grasped to select a cryo-cooler to be incorporated, whereby consumption of liquid helium is suppressed and a static magnetic field is generated stably. The superconducting magnet includes a superconducting coil, containers 209 and 203 for accommodating the superconducting coil and a refrigerant, a cooler 208 for liquefy gas once again, the gas having been obtained by vaporizing the refrigerant in the containers, and a means for measuring the amount of vaporized refrigerant, while keeping the pressure in the containers at a constant level. The heat quantity penetrating into the containers and the coolability of the cooler are measured accurately, thereby enabling a combination in which the coolability of the cooler to be combined has capacity more than the heat penetration amount.

22 Claims, 14 Drawing Sheets

SUPERCONDUCTING MAGNET, MAGNETIC RESONANCE IMAGING APPARATUS, AND METHOD OF CALCULATING COOLABILITY OF CRYO-COOLER

TECHNICAL FIELD

The present invention relates to a magnetic resonance imaging apparatus (referred to as "MRI apparatus") employing a superconducting magnet, and in particular, it relates to a selection of a cryo-cooler having necessary coolability.

BACKGROUND ART

An MRI apparatus that places a test subject in a homogenous magnetic field space for conducting a medical diagnosis according to a nuclear magnetic resonance (referred to as "NMR") signal is utilized in a medical institution, just like using a CT apparatus and an RI apparatus to conduct a conventional examination. In particular, an examination using the MRI apparatus shows a superior capability for detecting a lesion. This enhanced lesion detection capability is achieved because an MRI image enables various examination methods to produce not only a diagnostic image being simply morphologic, but also an image representing functional diagnostic information such as metabolism.

In order to acquire an MRI image that is medically effective from the MRI apparatus, there is required a static magnetic field generating means, enabling a long-term and stable maintenance of a high magnetic field and a homogeneous magnetic field space including deviation of a high PPM order. As a static magnetic field generator satisfying these necessary conditions as described above, a superconducting magnet is employed, which is configured in such a manner as accommodating a superconducting coil within a cryostat.

There are two types for the superconducting magnet; a cylindrical superconducting magnet which accommodates a superconducting solenoid coil within a cylindrical cryostat, and an open superconducting magnet in which the cryostats divided into two parts are placed in such a manner as opposed to each other, and a superconducting loop coil is accommodated concentrically within each of the cryostats (see patent document 1).

In any type of the superconducting magnet, there is a problem that heat penetration into the cryostat due to conduction and radiation, vaporizes and consumes a liquid helium refrigerant used for cooling the superconducting coil. Therefore, in order to prevent the consumption of the liquid helium, there is developed a superconducting magnet which incorporates a cryo-cooler having coolability for recondensing the helium gas which has been vaporized once (see patent document 2).

In order to implement a closed cryostat in which the cryo-cooler being incorporated completely condenses the vaporized helium gas to convert the helium gas back to the liquid helium, it is necessary to understand quantitatively, a heat penetration amount into the cryostat, a coolability of the cryo-cooler in the state of being incorporated into the cryostat, and a temporal change of the coolability.

This is because, the coolability of the cryo-cooler is deteriorated over time, and it is necessary to suppress the helium consumption, in association with the heat penetration amount into the cryostat and the deterioration of the coolability of the cryo-cooler. In addition, in order to maintain the coolability of the cryo-cooler, an overhaul cleaning operation is required at established intervals (typically, once every 10,000 hours running time). In the cleaning operation, the cryo-cooler is changed to a new one as resetting, or the cryo-cooler is again incorporated in the cryostat after the maintenance works are finished. Such resetting or incorporating operations include works for ensuring a thermal contact between a low-temperature part in the cryo-cooler and a heat shielding plate within the cryostat, and a quality of the works has a great influence on the coolability of the overall system. Therefore, in order to suppress the helium consumption, it is necessary to quantitatively grasp the coolability of the cryo-cooler in the state of being incorporated in the cryostat, not the coolability of an independent cryo-cooler.

There is a conventional method for grasping the coolability for overall system of the cryostat incorporating the cryo-cooler, in which the level variation of the liquid helium is observed by the use of a liquid-level meter being incorporated in the cryostat.

On the other hand, as a heat penetration amount measuring apparatus for the cryostat, there is suggested a system including a precision pressure regulator which keeps a pressure within a liquid storage tank to an arbitrary value, the regulator being provided at the outlet of a gas discharging tube for discharging gas vaporized from the refrigerant toward outside of the liquid storage tank, wherein, the heat penetration amount of the cryostat is obtained by measuring a flow amount of vaporized gas that is discharged through the gas discharging tube (see patent document 3, for example).

[Patent Document 1]
Japanese Unexamined Patent Application Publication No. 2002-336216
[Patent Document 2]
Japanese Unexamined Patent Application Publication No. 2005-237417
[Patent Document 3]
Japanese Unexamined Patent Application Publication No. H05-172924

DISCLOSURE OF THE INVENTION

Problem to be Solved by the Invention

Typically, in order to reduce heat penetration into a helium container storing liquid helium to the minimum, a cryostat being a vacuum chamber incorporates a heat shielding plate made of copper and/or aluminum or an aluminum evaporation film (also referred to as "superinsulator") for heat rejection. If the space prepared for the heat shielding plate or the superinsulator to be mounted is made larger, the space for the test subject is reduced more. Therefore, such component is required to be incorporated into the space as narrow as possible, and it is difficult to raise a mounting precision. Slight errors in dimension or in the mounting precision of the heat shielding plate or the superinsulator may have a great impact on the heat penetration amount into the helium container. Since the heat penetration amount varies by system, the amount of the liquid helium vaporized from the superconducting magnet being completed may vary by system.

Furthermore, the heat shielding plate or the superinsulator may undergo displacement to some extent, due to vibrations during transportation from a site of manufacturing the superconducting magnet to a medical facility. Consequently, there is a possibility that the heat penetration amount in the helium container at the stage of manufacture may be different from the heat penetration amount after the installation in the medical facility. There is another possibility that a quench occurs in the superconducting magnet during excitation process or the like. A drastic change of a magnetic field due to the quench may apply electromagnetic force on the heat shielding plate, and the shape thereof may vary to some extent, thereby changing the heat penetration amount.

Furthermore, pulse operations of a gradient magnetic field and an RF magnetic field for acquiring an MRI image may induce eddy current and/or mechanical vibrations in the helium container, resulting in the increase of penetration heat. The penetration heat into the helium container is apt to increase more and more, due to a speed enhancement of the MRI imaging technique and a newly introduced imaging method for enhancing the strength and change rate of the gradient magnetic field and the RF magnetic field.

As described above, the heat penetration amount into the cryostat varies in a complicated manner. Therefore, in order to properly balance the heat penetration amount into the cryostat and the coolability of the cryo-cooler, it is necessary to immediately grasp an accurate heat penetration amount into the cryostat and the coolability of the overall system including the cryostat.

However, in the conventional technique where a liquid-level meter is employed, a relatively long time is required to grasp the state of helium gas condensation. Therefore, it is not possible to immediately judge a quality level of the works for incorporating the cryo-cooler and judge whether or not the cryo-cooler newly incorporated has an adequate coolability against the heat penetration amount into the cryostat.

In the technique as disclosed in the patent document 3, even though it is possible to accurately measure the heat penetration amount into the cryostat, there is no means for evaluating the coolability of the cryo-cooler in the state being incorporated in the cryostat, the coolability of the overall system, and the quality of works for installing the cryo-cooler. In addition, it is not considered to suppress the helium consumption in accordance with a temporal deterioration of the coolability of the cryo-cooler. Furthermore, there is no consideration regarding management and operation, in the process of manufacturing, at the time of installation in a medical site, and at the time of daily running.

The coolability of the overall system including the cryostat may vary depending on the running status and environments. Since it is not possible to immediately grasp the coolability of the overall system including the cryostat in the technique disclosed in the patent document 3, it still remains as an unsolved problem to know the timing for maintenance and checking.

The present invention has been made considering the problems above, and an object of the present invention is to properly balance the heat penetration amount into the cryostat and the coolability of the cryo-cooler, without depending on the status and the environment of the system, so that the consumption of the refrigerant is rendered to be substantially zero.

Means to Solve the Problem

In order to solve the problem above, the present invention provides a magnetic resonance imaging apparatus, including a superconducting magnet which has a cryostat involving a superconducting coil for generating a static magnetic field and a refrigerant to cool the superconducting coil, a cryo-cooler being incorporated in the cryostat for recondensing the refrigerant being vaporized, a heater for providing heat to the cryostat, and a pipe for discharging gas vaporized from the refrigerant to the outside, wherein, the magnetic resonance imaging apparatus further including a heating value controller for controlling a heating value of the heater so as to reduce discharging amount of the gas, based on a gas flow rate having been measured by a gas flow measuring device being connected to the pipe, the gas flow measuring device controlling the gas flowing in the pipe to be at a constant pressure to measure the gas flow rate.

In order to solve the problem above, the present invention provides a superconducting magnet including, a cryostat involving a superconducting coil for generating a static magnetic field and a refrigerant to cool the superconducting coil, a cryo-cooler being incorporated in the cryostat for recondensing the refrigerant being vaporized, a heater for providing heat to the cryostat, and a pipe for discharging gas vaporized from the refrigerant to the outside, wherein, the superconducting magnet further includes a heating value controller for controlling a heating value of the heater so as to reduce discharging amount of the gas, based on a gas flow rate measured by the gas flow measuring device being connected to the pipe, the gas flow measuring device controlling the gas flowing in the pipe to be at a constant pressure to measure the gas flow rate.

In order to solve the problem above, the present invention provides a magnetic resonance imaging apparatus including a superconducting magnet which has a cryostat involving a superconducting coil for generating a static magnetic field and a refrigerant to cool the superconducting coil, a cryo-cooler being incorporated in the cryostat for recondensing the refrigerant being vaporized, a heater for providing heat to the cryostat, and a pipe for discharging gas vaporized from the refrigerant to the outside, wherein, the magnetic resonance imaging apparatus is provided with a refrigerant evaporation reducing method including a step for measuring a gas pressure of the refrigerant flowing in the pipe, a step for controlling a flow rate of the refrigerant gas in the pipe so as to render the gas pressure being measured to be at a predetermined level, a step for measuring a gas flow rate flowing in the pipe, and a step for controlling a heating value of the heater based on the gas flow rate being measured.

In order to solve the problem above, the present invention provides a magnetic resonance imaging apparatus including a superconducting magnet which has a cryostat involving a superconducting coil for generating a static magnetic field and a refrigerant to cool the superconducting coil, a cryo-cooler being incorporated in the cryostat for recondensing the refrigerant being vaporized, and a pipe for discharging gas vaporized from the refrigerant to the outside, wherein, the magnetic resonance imaging apparatus is provided with a coolability calculation method for calculating coolability necessary for the cryo-cooler, including a step for measuring a gas pressure of the refrigerant gas flowing in the pipe, a step for controlling a flow rate of the refrigerant gas in the pipe so as to render the gas pressure being measured to be at a predetermined level, a step for measuring a gas flow rate flowing in the pipe, a step for obtaining a heat penetration amount into the cryostat based on the gas flow rate being measured, and a step for calculating the coolability of the cryo-cooler based on the heat penetration amount.

EFFECT OF THE INVENTION

According to the present invention, it is possible to immediately grasp an accurate heat penetration amount into the cryostat. Therefore, without depending on the state and environment of the system, the heat penetration amount into the cryostat and the coolability of the cryo-cooler are balanced properly, and the consumption of the refrigerant is rendered to be zero substantially.

A basic effect of the present invention includes specific effects as the following in the specific situations as describe below:

(1) The heat penetration amount into the cryostat and the coolability of the cryo-cooler, installed in a medical facility, are properly balanced, thereby rendering the refrigerant consumption substantially zero.
(2) Even when the heat penetration amount varies due to the transportation of the superconducting magnet or quench, this variation is quantitatively grasped, and by incorporating a cryo-cooler with adequate coolability, the refrigerant consumption is rendered substantially zero.
(3) The heat penetration amount into the cryostat, according to various imaging methods employed in the medical facility, is quantitatively grasped, and by incorporating cryo-cooler with adequate coolability, the refrigerant consumption is rendered substantially zero.
(4) The heat penetration amount into the cryostat and the coolability of the cryo-cooler are measured periodically, judging whether or not the overall system is running with proper coolability, and if it is determined as improper, a corrective action is taken, so as to keep the refrigerant volume in the superconducting magnet to a stable level while performing the operation.

In addition, according to the present invention, the heat penetration amount into the cryostat and the coolability of the overall system including the cryostat are immediately grasped, and the result can be presented to an operator or a maintenance manager.

BEST MODE FOR CARRYING OUT THE INVENTION

Preferred embodiments of the present invention will be described with reference to the accompanying drawings. It is to be noted here that in all of the figures for explaining the embodiments of the present invention, corresponding functional elements are labeled the same, and the operations thereof shall not be tediously explained.

First Embodiment

A first embodiment of the present invention will be explained. The present embodiment is to control a pressure within a helium container to be at a constant level, and a helium gas outflow from the helium container is measured so as to accurately obtain a heat penetration amount into the helium container. Then, an optimum cryo-cooler is selected, which has coolability exceeding the heat penetration amount being obtained and incorporated into a superconducting magnet, thereby configuring a cryo system with an optimum coolability, being appropriate for each individual difference of the superconducting magnet. With reference to FIG. 1 to FIG. 5, the present embodiment will be explained in detail.

Firstly, an overview of the overall configuration of the present embodiment will be explained with reference to FIG. 1. FIG. 1 is a diagram showing the overall configuration of a superconducting MRI apparatus employing a superconducting magnet to which the present invention is applied. In the present embodiment, as shown in FIG. 1, a so-called open superconducting MRI apparatus employing an open superconducting magnet will be taken as an example for the explanation. It is to be noted, however, a so-called closed superconducting MRI apparatus may also be available, which uses a cylindrical superconducting magnet for generating a horizontal magnetic field.

The superconducting magnet 101 of open-structure for generating a static magnetic field in the open superconducting MRI apparatus is made up of an upper cryostat 103 and a lower cryostat 104, having an imaging space therebetween, where a test subject 102 is placed. Therefore, this configures an imaging space widely open horizontally. The upper cryostat 103 and the lower cryostat 104 are connected via a thin connecting tube 105, and multiple sensor circuits are incorporated therein for monitoring a supply of liquid helium into the upper and lower cryostats 103 and 104, and the operational status of the magnet. Even if the superconducting magnet 101 has two pieces of cryostat being divided, such arrangement of the connecting tube 105 as described above may achieve an operation and management of a configuration of closed cryostat, such as a superconducting magnet made up of one piece of cryostat, the configuration recondensing the vaporized helium gas for reuse. Output signals from the sensor circuits are taken out from a terminal 106 of the upper cryostat 103, and inputted into a cryo-control unit 107. Furthermore, a cryo-cooler 108 is mounted on the upper cryostat 103. The cryo-cooler 108 is connected to a compressor unit 109 which transfers helium gas being compressed to the cryo-cooler 108. A service port 110 is also mounted on the upper cryostat 103, functioning as an inlet for injecting the liquid helium and as an outlet for discharging outside the helium gas that failed to be condensed due to a breakdown of the cryo-cooler 108, or the like. A helium gas measuring unit 111, which will be described below in detail, is connected to an end of the service port 110.

A gradient magnetic field coil 112 for generating a gradient magnetic field is mounted on the inner side of the superconducting magnet 101. A flat sheet structure coil is employed as the gradient magnetic field coil 112, so as not to hinder the open structure of the superconducting magnet 101. According to the pair of coils vertically arranged, coils of x, y, and z (not specified in the figure) are stacked for generating magnetic field gradients in three axial directions being orthogonal to one another. For example, when a current is applied to the upper z-coil and the lower z-coil, the upper z-coil generates a magnetic flux in the same direction as the magnetic flux generated by the superconducting magnet 101, and the lower z-coil generates a magnetic flux in the direction being different by 180 degrees therefrom. Consequently, the gradient magnetic field is generated, where the magnetic flux density gradually decreases from the upper side to the lower side of the vertical axis (z-axis) of the imaging space in which the test subject 102 is placed. Similarly, the x-coil and the y-coil provide the gradient to the magnetic flux along x-axis and to the magnetic flux along y-axis, respectively, the magnetic flux being generated by the superconducting magnet 101. A gradient magnetic field power amplifier 113 is connected, in such a manner that a current flows for a desired period of time, independently in each of the x-coil, y-coil, and z-coil of the gradient magnetic field coil 112.

An RF coil 114 is incorporated inside the gradient magnetic field coil 112. A flat plate structure coil is also employed as the RF coil 114, so as not to hinder the open structure of the superconducting magnet 101. An RF power amplifier 115 supplies RF current corresponding to a resonance frequency of a nuclear spin, and the RF coil 114 arranged in a pair vertically generates an RF magnetic field necessary for resonantly exciting the nuclear spin in the imaging space where the test subject 102 is placed. In the present embodiment, for example, 29.8 MHz is chosen for a hydrogen nucleus to cause a nuclear magnetic resonance in the magnetic field intensity of 0.7 Tesla. By combining the gradient magnetic field described above with the RF magnetic field, the hydrogen nuclear spin at a particular portion of the test subject 102 is selectively excited resonantly, so as to provide a precession of the nuclear spin with three-dimensional position information.

A detection coil 116 for detecting an NMR signal is placed at the innermost position, i.e., in proximity to a portion to be examined of the test subject 102. This detection coil 116 efficiently detects the nuclear spin precession described above in the form of electrical signals. The NMR signals converted into the electrical signals are inputted and amplified in an RF amplification unit 117, and then subjected to conversion into digital signals appropriate for computer processing.

The cryo-control unit 107, the compressor unit 109, the gradient magnetic field power amplifier 113, the RF power amplifier 115, and the RF amplification unit 117 are connected to a computer 118 via a system signal bus line 119. Control signals from a pulse sequencer (not illustrated) within the computer 118 controls the operations of each unit via the system signal bus line 119. On the other hand, the computer 118 subjects MR signals being converted into digital signals to a process to convert into an image or the like, which is to be used for diagnosis, and stores the conversion result in a memory (not illustrated in the figure) within the computer 118, as well as displaying it on the display unit 120. The computer 118 monitors an operating status of each unit constantly or at regular intervals, via the system signal bus line 119, so as to record the status, as well as transmitting operating management information of the system to a remote monitoring center 123, via a communication controller 121 such as modem and LAN. The remote monitoring center 123 conducts a remote control based on such information as described above. By way of example, according to the signal from the cryo-control unit 107, the computer 118 records in the memory, a value indicating a remaining quantity of the liquid helium of the superconducting magnet 101 at regular intervals, for instance, first in every morning. Then, the computer 118 calculates and manages the consumed amount, outputs the information from the communication controller 121, and displays the descriptions on the display unit 120.

Next, with reference to FIG. 2, a detailed configuration of the superconducting magnet 101 will be explained. FIG. 2 is a sectional view being parallel to the static magnetic field, showing the superconducting magnet 101 in detail, which is employed in the open MRI apparatus as shown in FIG. 1. In this figure, an upper superconducting coil 201 and a lower superconducting coil 202 for generating a magnetic field are accommodated respectively in the upper cryostat 103 and the lower cryostat 104. The imaging space 203, approximately 40 cm in diameter, which is located at a center between the upper and lower superconducting coils 201 and 202, achieves the magnetic field density of 0.7 Tesla and magnetic field homogeneity of 3 ppm or less. The present figure indicates the case where one unit of superconducting coil constitutes each coil. However, typically, each coil is configured in such a manner that multiple superconducting coils are combined so as to enhance the magnetic field homogeneity and reduce the intensity of leakage magnetic field. In order to achieve objective magnetic field homogeneity, shim plates 204 in pairs are placed on the sides facing to the imaging space 203 in the superconducting magnet 101 according to the present embodiment. Multiple shim coils (not illustrated) are incorporated in the shim plates 204, and these shim coils are provided with current to generate a necessary correcting magnetic field. In the present embodiment, a method for enhancing the magnetic field homogeneity is further combined, in which multiple small iron pieces (not illustrated) are incorporated in the shim plates 204, thereby correcting the magnetic flux distribution generated by the upper and lower superconducting coils 201 and 202.

The upper and lower superconducting coils 201 and 202 are surrounded respectively by an upper helium container 205 and a lower helium container 206 for storing the liquid helium surrounding each of the coils. The upper helium container 205 and the lower helium container 206 are connected via the connecting tube 105, and the upper helium container 205 and the lower helium container 206 are filled with the liquid helium simultaneously. The connecting tube 105 is further provided with a superconducting lead line for connecting the upper and lower superconducting coils 201 and 202, and the sensor circuits as described below.

A heat shielding plate 207 is incorporated on the outer circumference of the upper and lower helium containers 205 and 206. The heat shielding plate 207 is a copper plate or an aluminum plate having a good thermal conduction, configuring the thickness thereof as 2 millimeters, for instance. In order to prevent the radiation heat penetration into the upper and lower helium containers 205 and 206, the outer side of the heat shielding plate 207 carries a super insulator 208 made of polyethylene film being mirror-finished by aluminum evaporation, all over the surface without leaving any space.

A vacuum chamber 209 is provided outermost, which is made of stainless steel being 15 millimeters in thickness. Gaps between the vacuum container 209 and each of the upper helium container 205, the lower helium container 206, and the connecting tube 105, are vacuum layers, and each of the elements are fixed by multiple load bearing rods (not illustrated) made of fiberglass reinforced plastics (FRP) having low thermal conductivity. In order to secure the imaging space 203 as large as possible, the vacuum layer inside is formed to be as narrow as possible, and the heat shielding plate 207 and the super insulator 208 are incorporated therein. The upper helium container 205 incorporates a liquid sensor 210 for measuring the liquid helium surface, a temperature sensor 211, and a heater 212, and signal lines are connected so as to perform outputting from the terminal 106. A power section used for the heater 212 is built in the cryo-control unit 107, and the cryo-control unit 107 directly controls the power section, thereby controlling a heating value of the heater 212.

In addition, the upper helium container 205 is equipped with the service port 110 for injecting the liquid helium and for discharging outside the helium gas vaporized from the upper and lower helium containers 205 and 206. The service port 110 incorporates two valves; a valve 213 manually opened and closed, for injecting the liquid helium or the like, and a unidirectional valve 214 for discharging outside the helium gas vaporized from inside and preventing the external air from flowing backward into the upper helium container 205.

Furthermore, an upper central portion of the upper helium container 205 is provided with a cryo-cooler insertion hole 215, into which the end of the cryo-cooler 108 is incorporated. The compressor unit 109 is connected to an injection port 216 of the cryo-cooler 108 so that helium gas being compressed is applied. In sync with reciprocal motion of a displacer (not illustrated), incorporated in the cryo-cooler 108, the helium gas being compressed expands in the process of passing through a cold storage material within the displacer, thereby lowering the temperature. A pipe arrangement is configured in such a manner that the helium gas being expanded is brought back into the compressor unit 109 from an exhaust port 217, and then it is compressed again so as to be circulated. In the present embodiment, the displacer having two stages is included in the cryo-cooler 108. The displacer of the first stage is filled with lead spheres serving as the cold storage material, and the outer case 218 of the first stage displacer is cooled to 50 degrees Kelvin-temperature.

The displacer of the second stage is filled with Holmium Copper 2 (HoCu$_2$) serving as the cold storage material, and the outer case 219 of the displacer of the second stage is cooled to 3.7 degrees Kelvin-temperature.

The outer case 218 of the first-stage displacer is arranged in such a manner as thermally contacting the heat shielding plate 207 which covers the outer circumference of the upper and lower helium containers 205 and 206. In this thermal contact, a good thermal conduction can be obtained by engaging a material having a good thermal conduction, e.g., indium line (not illustrated), with the contact surface between the outer case 218 of the first-stage displacer and the heat shielding plate 207. The outer case 219 of the second-stage displacer is arranged inside a cryo-cooler insertion hole 215 of the upper helium container 205, and it is configured in such a manner as directly cooling the vaporized helium gas. The present embodiment employs a method allowing the outer case 219 of the second-stage displacer to directly cool the helium gas. However, it is also possible to employ an indirect method in which a part of the upper helium container 205 is cooled via a material having a good thermal conduction such as an indium material, thereby liquefying the helium gas.

Here, it is ideal that a ratio of the helium gas to be liquefied by the cryo-cooler 108 is equal to the helium quantity vaporized from the upper and lower helium containers 205 and 206. In other words, it is desirable to equalize the coolability of the cryo-cooler 108 with the heat penetration amount into the upper and the lower helium containers 205 and 206. The present embodiment employs the cryo-cooler 108 which has coolability sufficiently higher than the heat penetration amount into the upper and lower helium containers 205 and 206. Furthermore, in the present embodiment, the upper helium container is provided with the heater 212, and an excessive coolability of the cryo-cooler 108 is offset by the heating value of the heater 212.

Next, with reference to FIG. 3 to FIG. 5, there will be explained details of means and method for measuring the heat penetration amount into the helium containers.

(Measurement of Helium Gas Flow Rate)

Initially, with reference to FIG. 3, an overall configuration of the helium gas measuring unit 111 will be explained. FIG. 3 illustrates one example of the overall configuration of the helium gas measuring unit 111 as shown in FIG. 1. A T-joint 301 is mounted on the service port 110. One side of the T-joint 301 is connected to a regulator 303 via the rubber hose 302, and the other side is fixed to a pressure sensor 304 via the rubber hose 302. An output signal from the pressure sensor 304 is inputted in the input terminal of a control circuit 305, and an output from the control circuit 305 is inputted into a controller 306 of the regulator 303. In addition, a base 307 on the other side of the regulator 303 is connected to a flow meter 308 via the rubber hose 302. The flow meter 308 is connected to a flow rate display meter 309 which converts a signal being measured into a flow rate and displays the result. In addition, the control circuit 305 and the flow rate display meter 309 are connected to the computer 118 via the system signal bus line 119, so as to send and receive control signals and various measured information items.

Next, with reference to FIG. 4, a detailed configuration of the regulator 303 will be explained. As shown in FIG. 4, the regulator 303 incorporates a needle 401 and a mount 402 accommodating the needle 401 therein, allowing the needle to fit into the mount. The needle 401 is made up of a cone-shaped tip and a cylindrical body member. The mount 402 has a cone-shaped concave part into which the tip of the needle 401 fits, and a cylindrical cavity part into which the body member of the needle 401 fits. The body member of the needle 401 is connected to the controller 306, in such a manner as allowing the side surface sealed by an O-ring 403 to slide along the side surface of the cavity part of the mount 402. The O-ring 403 is incorporated and fixed in the concave part on the side surface of the cylindrical cavity part of the mount 402. The controller 306 allows the cone-shaped tip of the needle 401 to move vertically, and change the gap between the tip and the cone-shaped concave part of the mount 402, thereby varying the gas flow rate from an inlet connector 404 to an outlet connector 307.

According to the configuration as shown in FIG. 3 and FIG. 4, the gas pressure in the upper and lower helium containers 205 and 206 is controlled so that the pressure is kept to be a predetermined constant value at any time. Specifically, the control circuit 305 controls the controller 306 of the regulator 303, so that the input signal from the pressure sensor 304 is kept to be a predetermined constant value at any time. By way of example, when the gas flow rate within the regulator 303 becomes larger and the pressure at the inlet connector 404 as a supplying side becomes lower than the predetermined value, the pressure value is transferred to the input terminal of the control circuit 305 as a change of the output signal from the pressure sensor 304. The output signal from the control circuit 305 is applied to the controller 306 of the regulator 303, performing control to move the needle 401 downwardly, so as to narrow the gap between the cone-shaped tip of the needle 401 and the cone-shaped concave part of the mount 402. Accordingly, the gas flow rate is decreased, and the gas pressure within the upper and lower helium containers 205 and 206 as the supplying side is restored to the predetermined value. Conversely, when the gas flow rate becomes smaller, and the pressure at the inlet connector 404 as supplying side is increased larger than the predetermined value, the control circuit 305 performs a control to raise the needle 401, so as to enlarge the gap between the cone-shaped tip and the cone-shaped concave part of the mount 402. Accordingly, the gas flow rate increases, lowering the gas pressure within the upper and lower containers 205 and 206, whereby the predetermined value is restored.

In other words, the configuration as shown in FIG. 3 and FIG. 4 can be assumed as a feedback control loop for keeping the gas pressure at a predetermined constant value at any time within the upper and lower helium containers 205 and 206. If the configuration as shown in FIG. 3 and FIG. 4 is re-illustrated from a viewpoint of this control loop, it is shown as FIG. 5. Using the flow rate and the pressure of the gas flowing in the rubber hose 302 as media, the pressure sensor 304, the control circuit 305, and the regulator 303 constitute the feedback control loop. Then, by adjusting the speed of the control circuit 305 and the controller 306, and properly setting the response from the vertical motion of the needle 401, the gas pressure is controlled to be a predetermined constant value all the time with exquisite precision. Under the constant pressure controlled as described above, the flow meter 308 measures the gas flow rate, and converts the signal into the flow rate to be displayed on the flow rate display meter 309.

Following is an actual example for measuring the gas flow rate while holding the gas pressure to be constant according to the configuration as shown in FIG. 3 to FIG. 5. In order words, after the service port 110 of the superconducting magnet 101 is connected to the helium gas measuring unit 111 as shown in FIG. 3, the manual valve 213 is opened, and the output from the unidirectional valve 214 is completely closed. According to the operation above, the helium gas vaporized within the upper and lower helium containers 205 and 206 is discharged outside via the manual valve 213, the regulator 303, and the flow meter 308. Next, an operator sets a pressure value via an input means (not illustrated) which is provided on the control circuit 305. By way of example, the value is set to be 760 mmAq. The control circuit controls the controller 306 of the regulator 303, so that the input signal from the pressure sensor 304 is kept to be a preset pressure value (here, 760 mmAq) all the time. Accordingly, while keeping the upper cryo container 205 to be under a constant pressure of 760 mmAq, the operator is allowed to read the helium gas rate being vaporized via the flow rate display meter 309. It is alternatively possible for the computer 118 to read the gas pressure and the gas flow rate being measured under the pressure, via the system signal bus line 119, so as to store the data in the memory within the computer 118 and display the data on the display unit 120.

As described so far, the helium gas measuring unit 111 is connected to the service port 110 of the superconducting magnet 101, thereby keeping the pressure in the upper helium container 205 to be a constant value all the time without any variations, and enabling an accurate measurement of the helium gas rate vaporized in the upper and lower helium containers 205 and 206.

There has been explained hereinabove, a configuration and operations of each element for keeping the gas pressure to be a constant value, so as to measure the gas flow rate. FIG. 6 shows an organized control flow to keep the gas pressure to be a constant value and measure the gas flow rate. FIG. 6 is a flowchart showing this control flow. Hereinafter, each step constituting the control flow of FIG. 6 will be explained in detail.

Helium gas is supplied to the helium gas measuring unit 111 (step 601). Specifically, after the helium gas measuring unit 111 is connected to the service port 110 of the superconducting magnet 101, the operator opens the manual valve 213, and completely closes the output from the unidirectional valve 214.

The operator sets a pressure value to be kept constant (step 602). Specifically, the pressure value is set in the control circuit 305. For example, it is set to be 760 mmAq.

The gas pressure sensor 304 measures the gas pressure in the upper and lower helium containers 205 and 206 (step 603). Specifically, the gas pressure sensor 304 measures the pressure of gas flowing in the rubber hose 302. The gas pressure being measured is inputted into the control circuit 305.

The control circuit 305 determines whether or not the gas pressure being measured in step 603 is larger than the gas pressure value set in step 602 (step 604). If the measured value is larger, the process proceeds with step 605, and if it is not larger, the process proceeds with step 606.

The control circuit 305 reduces the gas pressure (step 605). Specifically, the control circuit 305 performs a control to raise the needle 401, so as to enlarge the gap between the cone-shaped tip and the cone-shaped concave part of the mount 402. Accordingly, the gas flow rate flowing in the rubber hose 302 increases, lowering the gas pressure within the upper and lower containers 205 and 206, and thereby approaching the predetermined value. Thereafter, the process returns to step 603, and the control circuit 305 measures the gas pressure once again.

On the other hand, when it is determined that the gas pressure measured in step 603 is not larger than the gas pressure value set in step 602, it is then determined whether or not the measured value is smaller than the gas pressure value being set in step 602 (step 606). If the measured value is smaller, the process proceeds with step 607, and if it is not smaller, it is found that the gas pressure is equal to the set value, then, a signal indicating that the gas pressure becomes equal to the set value is transmitted to the computer 118, and the process proceeds with step 608.

The control circuit 305 augments the gas pressure (step 607). Specifically, the control circuit 305 performs control to move the needle 401 of the regulator 303 downwardly, so as to narrow the gap between the cone-shaped tip of the needle 401 and the cone-shaped concave part of the mount 402. Accordingly, the gas flow rate flowing in the rubber hose 302 is decreased, increasing the gas pressure within the helium containers (205, 206) on the supplying side, thereby approaching the set value. Thereafter, the process returns to step 603, and the control circuit 305 measures the gas pressure once again.

When the computer 118 notifies that the gas pressure within the upper and lower helium containers 205 and 206 becomes equal to the gas pressure value set in step 602, the flow meter 308 measures the gas flow rate (step 608). Specifically, the flow meter 308 obtains the gas flow rate flowing in the rubber hose 302 and displays it on the flow rate display meter 309. It is further possible for the computer 118 to read the gas pressure being set and the gas flow rate being measured at that time, via the system signal bus line 119, and these values may be stored in the memory in the computer 118, and displayed on the display unit 120.

The control circuit 305 determines whether or not the measurement of the gas flow rate is terminated (step 609). If the measurement continues, the process returns to step 603, and the steps 603 to 608 are repeated. The control flow as described above enables the measurement of the gas flow rate, while maintaining the gas pressure at the level being set.

(Estimation of the Heat Penetration Amount into the Helium Container)

Next, with reference to FIG. 7, estimation of the heat quantity penetrating into the helium containers will be explained. FIG. 7 is a configuration diagram which re-illustrates the aforementioned configurations shown in FIG. 1 to FIG. 5, from the viewpoint of heat balance. As shown in FIG. 3, the helium gas measuring unit 111 is connected to the service port 110 of the superconducting magnet 101, whereby the helium gas amount vaporized in the upper and lower helium containers 205 and 206 can be measured accurately, without changing the pressure in the upper helium container 205. In the configuration as described above, when the sum of the heat quantity A penetrating into the upper and lower helium containers 205 and 206, and the heating value B of the heater 212 mounted on the upper helium container 205 is equal to the coolability C of the cryo-cooler 108, the liquid helium will not vaporize. Here, when the heater 212 and cryo-cooler 108 are brought to a halt, the helium gas vaporized by the heat penetration A, caused by the conduction and irradiation, is accumulated in the upper portion of the upper helium container 205. The helium gas being accumulated is discharged outside from the service port 110 via the regulator 303. On that occasion, the pressure sensor 304, the control circuit 305, and the regulator 303 constitute the feedback control loop as shown in FIG. 5, via the helium gas flowing in the rubber hose 302, and therefore they are controlled so that the gas pressure is kept constant. According to the process as described above, the pressure within the upper helium container 205 is kept constant without any change, and when the heater 212 and the cryo-cooler 108 are brought to a halt, the flow meter 308 is allowed to measure the helium gas flow rate which is accumulated in the upper helium container 205.

As discussed above, the helium gas rate obtained by the flow meter 308 under the constant pressure and displayed on the flow rate display meter 309, are used to calculate the heat penetration amount into the upper and lower helium containers 205 and 206. The calculation above enables acquisition of an accurate heat quantity calculated from the helium gas amount being discharged, by calibrating the helium gas amount discharged every minute, latent heat of the liquid helium, and a pressure which is generated by a change of volume occupied by the liquid helium and the helium gas within the liquid helium containers. In other words, the helium gas amount discharged every minute is corrected at 0° C. and at 1 atmospheric pressure and assumed as LHe (liter/min), an evaporative latent heat is assumed as HHe (kcal/kg), a density of the helium gas is assumed as (g/m³), and then, the heat quantity CV(W) calculated from the helium gas amount being discharged is expressed as the following formula 1:

$$CV = LHe \times D_G He \times HHe \times 10^{-3} \times 4.2/60 \quad \text{(Formula 1)}$$

Here, 1 cal=4.2 J, 1 J/sec=1 W.
Physicochemical constant of helium is as the following:
Evaporation latent heat HHe of liquid helium: 5.50 kcal/kg
Density of helium gas $D_G$He: 178 g/m³ (at 0° C. and at 1 atmospheric pressure)

Therefore, if it is assumed that the liquid helium being consumed by the superconducting magnet is discharged 1.0 liter/min at 0° C. and at 1 atmospheric pressure, the heat quantity CV, i.e., the heat penetration amount is obtained as the following:

$$CV = 1.0 \text{ liter/min} \times 178 \text{ g/m}^3 \times 5.5 \text{ kcal/kg} \times$$
$$10^{-3} \times 4.2 \text{ J/cal}/60$$
$$= 0.069 \text{ W (because 1 J/sec = 1 W)}$$

On the other hand, in the case of the MRI apparatus as shown in FIG. 1, for instance, each volume of the upper and lower helium containers (205, 206) is 370 liters. By way of example, it is possible to calculate the heat quantity penetrating into the upper and lower helium containers as 343 milliwatt, when 5 liters of helium gas is discharged every minute in the state where the gas pressure is set and maintained at 760 mmAq. As thus described, since the volume of the helium gas being vaporized is changed easily by the pressure, it is essential to measure the helium gas rate being discharged from the superconducting magnet at a constant pressure, in order to calculate an accurate heat quantity.

(Selection of Cryo-cooler)

Finally, there will be explained a selection of cryo-cooler having the coolability being sufficient as against the heat penetration amount into the helium container, the amount being obtained accurately in the way as described above. By way of example, it is assumed that when the superconducting magnet having the helium container of 740 liters in volume is left as it is without any action, and the gas pressure is set to be kept at 760 mmAq, the discharging amount of the helium gas is 5 liters per minute. Under this condition, the heat penetration amount into the helium container is calculated as 343 milliwatt. In the situation above, when the gradient magnetic field and the RF magnetic field are driven for imaging and the helium gas being discharged is increased by 0.5 liters, rendering the overall discharged amount of the helium gas as 5.5 liters, the heat penetration amount increased upon imaging is 35 milliwatt, and it is possible to obtain the total heat penetration amount as 378 milliwatt.

For the cryo-cooler 108 that is incorporated into the superconducting magnet having the heat penetration amount as described above, it is determined to be necessary to have the coolability equal to or higher than approximately 500 milliwatt, which is obtained by adding 120 milliwatt to 378 milliwatt. The value 120 milliwatt is obtained assuming 50 milliwatt as a loss produced when incorporating the cryo-cooler, for example, and further 70 milliwatt as coolability that is deteriorated due to temporal change until the time of the next regular maintenance of the cryo-cooler, for example. By selecting the cryo-cooler 108 having such coolability as described above to be incorporated into the superconducting magnet, the helium gas is stably liquefied, and it is possible to stock the liquid helium in the helium container for stably cooling the superconducting coil.

The cryo-cooler 108 having the coolability, being selected as described above, is incorporated in the superconducting magnet, and initially, the coolability of the cryo-cooler 108 exceeds the heat penetration amount into the cryostat. Therefore, the heating value of the heater 212 is increased so that the coolability C of the cryo-cooler 108 becomes equal to the sum of the heat quantity A penetrating into the upper and lower helium containers 205 and 206, and the heating value B of the heater 212 (C=A+B). According to lowering of the coolability of the cryo-cooler due to the subsequent temporal change, the heating value of the heater 212 is controlled, so that the coolability C of the cryo-cooler 108 is constantly equal to the sum of the heat quantity A penetrating into the upper and lower helium containers, and the heating value B of the heater 212.

The control of the heating value B of the heater 212 is conducted along with the following manner, for instance. By means of the helium gas measurement unit 111 having the aforementioned configuration as shown in FIG. 3, a helium gas flow rate from the upper and lower helium containers 205 and 206 is obtained at the pressure being a preset value. If the helium gas flow rate is zero, it indicates the state that the coolability C of the cryo-cooler 108 is equal to the sum of the heat quantity A, penetrating into the upper and lower helium containers 205 and 206, and the heating value B of the heater 212. On the other hand, the helium gas flow rate is not zero from the upper and lower helium containers 205 and 206, it indicates the state that the coolability C of the cryo-cooler 108 is smaller than the sum of the heat quantity A penetrating into the upper and lower helium containers 205 and 206, and the heating value B of the heater 212 (C<A+B). This helium gas flow rate is equal to the degradation of the coolability of the cryo-cooler 108, and a virtual heat penetration amount into the upper and lower helium containers 205 and 206 corresponding to the degradation can be obtained. Under this condition, the heating value B of the heater 212 is controlled, so that the coolability C of the cryo-cooler 108 becomes the sum of the heat quantity A, penetrating into the upper and lower containers 205 and 206, and the heating value B of the heater 212. In other words, the heating value B of the heater 212 is reduced by the amount corresponding to the virtual heat penetration amount. Then, maintenance or replacement of the cryo-cooler 108 is to be performed, immediately before the coolability C of the cryo-cooler 108 becomes lower than the heat penetration amount A into the upper and lower helium containers 205 and 206 (C<A), even though the heating value B of the heater 212 is set to zero. Specifically, when the heating value of the heater 212 becomes a predetermined threshold $B_0$ and $C<A+B_0$ is established, an operator is informed that maintenance and checking of the cryo-cooler are necessary, urging the operator to do such maintenance or replacing works.

The computer 118 may read the heating value of the heater 212 via the cryo-control unit 107 and the system signal bus line 119, store the value in the memory, and display the value on the display unit 120. It is further possible for the computer 118 to read out at a later time, the heating value data stored in time series, for predicting a time of maintenance or replacement of the cryo-cooler 108 according to the temporal change of the data, and display the temporal change on the display unit 120.

In the description above, there has been explained a process that the heat penetration amount into the helium container is accurately obtained, a cryo-cooler having required coolability is selected, and the system is activated while controlling the consumption of the refrigerant is substantially to be zero, by incorporating the selected cryo-cooler being selected. This process is organized as shown in FIG. 8. FIG. 8 is a flow chart showing a flow of the present process. Hereinafter, each of the steps constituting the process flow as shown in FIG. 8 will be explained in detail. Here, an explanation will made, taking as an example the case where the threshold $B_0$ of the heating value is zero, the threshold being used for determining whether or not maintenance and checking are necessary.

The helium gas flow rate from the upper and lower helium containers 205 and 206 is measured (step 801). This measurement is performed while the heater 212 and the cryo-cooler 108 are brought to a halt. Preferably, in the state where the heat penetration amount into the helium containers is at the maximum, for example, the helium gas flow rate is measured while executing a sequence for acquiring a diffusion-weighted image or EPI sequence. Details of the helium gas flow measurement have been described above.

According to the helium gas flow rate being measured in step 801, the heat penetration amount into the upper and lower helium containers 205 and 206 can be obtained (step 802).

According to the heat penetration amount into the upper and lower helium containers 205 and 206 obtained in step 802, necessary coolability of the cryo-cooler is decided, and the cryo-cooler having the coolability is selected (step 803).

The cryo-cooler 108 having the coolability selected in step 803 is incorporated in the superconducting magnet (step 804). Then, a heating value corresponding to an excessive coolability of the cryo-cooler 108 being selected is set as the heating value of the heater 212. In the state being combined as described above, the coolability C of the cryo-cooler 108 becomes equal to the sum of the heat quantity A penetrating into the helium containers and the heating value B of the heater 212, thereby suppressing the vaporization of the liquid helium. The MRI apparatus is driven for a while under this condition, and the following step 805 to step 809 are repeated while an actual imaging is performed.

After a lapse of a certain period of time, the helium gas flow rate is measured (step 805). Specifically, while the cryo-cooler 108 and the heater 212 are activated, the helium gas measuring unit 111 having the aforementioned configuration as shown in FIG. 3 is used to obtain the helium gas flow rate from the helium containers at the pressure being the set value.

It is determined whether or not there is any helium gas flow (step 806). If there is a helium gas flow, the process proceeds with step 807. If there is no helium gas flow, the process returns to step 805, and the measurement of the helium gas flow rate is repeated.

The heating value of the heater 212 is controlled (step 807). In general, since the coolability of the cryo-cooler 108 is lowered due to the temporal change, the heating value B of the heater 212 is reduced so that the coolability C of the cryo-cooler 108 becomes equal to the sum of the heat quantity A penetrating into the upper and lower helium containers 205 and 206, and the heating value B of the heater 212. Specifically, based on the helium gas flow rate measured in step 805, a virtual heat penetration amount into the upper and lower helium containers 205 and 206 is estimated. This virtual heat penetration amount corresponds to the lowered amount of the coolability of the cryo-cooler 108. The heating value B of the heater 212 is reduced by the amount corresponding to the virtual heat penetration amount.

It is determined whether or not the heating value of the heater 212 is zero (step 808). If it is zero, this information is displayed, and the process proceeds with step 809, and if it is not zero, the next step is step 805.

If the heating value of the heater 212 is zero, it indicates that the coolability C of the cryo-cooler 108 is deteriorated approximately to the level lower than the heat penetration amount A into the upper and lower containers 205 and 206. Therefore, the operator performs maintenance or replacement of the cryo-cooler 108. After the maintenance or the replacement, the process is resumed from step 801 as appropriate (step 809).

According to the processing flow as described above, it is possible to select the cryo-cooler 108 having appropriate coolability, and it is also possible to control the coolability C of the cryo-cooler 108 so as to exceed the heat penetration amount A into the upper and lower helium containers 205 and 206 constantly. Furthermore, the maintenance or replacement of the cryo-cooler 108 can be conducted at an appropriate time, even when the coolability C of the cryo-cooler 108 is deteriorated to the level lower than the heat penetration amount A into the upper and lower helium containers 205 and 206.

Hereinabove, an explanation has been made regarding the present embodiment. According to the present embodiment, the heat penetration amount into the helium containers can be accurately obtained, and therefore it is possible to select a cryo-cooler having optimum coolability in accordance with the heat penetration amount into the helium containers. With such basic effect, the heat penetration amount into the helium containers and the coolability of the cryo-cooler are properly balanced, enabling the consumption of the liquid helium serving as a refrigerant to be kept zero substantially for a long period of time. Even when the heat penetration amount into the helium containers is changed, the variation is grasped quantitatively, and the cryo-cooler having adequate coolability is incorporated, thereby rendering the consumption of the refrigerant to be substantially zero. In addition, the heat penetration amount according to various imaging methods used in a medical facility is quantitatively grasped, and the cryo-cooler having adequate coolability is incorporated, thereby rendering the consumption of the refrigerant to be substantially zero.

It is to be noted that the present embodiment can be implemented in the similar manner also in the superconducting magnet as a single unit, and the same effect can be expected.

Second Embodiment

Next, a second embodiment of the present invention will be explained. In the present embodiment, the measurement of the helium gas flow rate and the control of the heating value of the heater are performed at a constant frequency, and the maintenance or replacement of the cryo-cooler is notified as well. The MRI apparatus, the measurement of the helium gas flow rate, and the control of the heating value in the present embodiment are the same as those in the first embodiment. Therefore, detailed explanations thereof will not be tediously made, and only different points will be explained in detail in the following. Hereinafter, the present embodiment will be explained in detail with reference to FIG. 1 and FIG. 3.

In the present embodiment, as shown in FIG. 1 and FIG. 3, the helium gas measuring unit 111 is connected to the service port 110 of the superconducting magnet 101 on a steady basis. The valve 213 and the unidirectional valve 214 are respectively provided with drive divisions (valve drive divisions), not illustrated, and controllers (valve controllers) for controlling the valve drive divisions. The valve controllers are connected to the computer 118, and control the valve drive divisions under the control of the computer 118. As shown in FIG. 1, the helium gas measuring unit 111 is connected to the computer 118, activated by a control signal from the computer 118, and further notifies the computer 118 of a result of the measurement. More in detail, as shown in FIG. 3, the control circuit 305 in the helium gas measuring unit 111 and the flow rate display meter 309 are each connected to the computer 118, activated by a control signal from the computer 118, and the computer 118 is notified of the result of the measurement. By way of example, a set value of the pressure is inputted from the computer 118 into the control circuit 305, and the flow rate display meter 309 notifies the computer 118 of a value of the gas flow rate. In addition, the heater 212 is connected to the computer 118 via the cryo-control unit 107, and the heating value of the heater is controlled via the cryo-control unit 107, under the control of the computer 118.

In such a configuration as described above, after opening the valve 213 and completely closing the output from the unidirectional valve 214, the computer 118 controls the control circuit 305, the flow rate display meter 309, and the heater 212 in such a manner that the processes from step 805 to step 808 as shown in FIG. 8 are repeated at regular intervals. On this occasion, it is also possible to display the gas pressure set in the control circuit 305, the gas flow rate obtained from the flow rate display meter 309, and the heating value of the heater 212 sequentially on the display unit 120. Then, when the coolability C of the cryo-cooler 108 is below the heat penetration amount A into the helium containers, the operator is notified of the situation as a warning, as well as prompting the operator to perform maintenance or replacement of the cryo-cooler 108. By way of example, a warning message may be displayed on the display unit 120 and/or an alarm may be sounded. On the other hand, after the processes from step 805 to step 808 are finished, if the coolability C of the cryo-cooler 108 goes over the heat penetration amount A into the helium containers, measuring the gas flow rate is terminated, and the valve 213 is completely closed. Then, the output from the unidirectional valve 214 is opened, in order to restore the state as is before the measurement.

The present embodiment has been explained according to the description above. In the present embodiment, the heat penetration amount into the helium containers and the coolability of the cryo-cooler are measured at regular intervals, judging whether or not the overall system is operated with proper coolability. If the judgment is negative, the operator is promoted to take a corrective action, thereby keeping the refrigerant volume in the superconducting magnet to a stable level while performing the operation.

It is to be noted that the present embodiment can be implemented in the superconducting magnet as a single unit in the similar manner, and the same effect can be expected.

Third Embodiment

Next, a third embodiment of the present invention will be explained. The present embodiment is to perform the measurement of the helium gas flow rate and the control of the heating value of the heater at regular intervals, according to a remote monitoring, and grasp whether or not it is necessary to perform maintenance or replacement of the cryo-cooler. Since the MRI apparatus, the measurement of the helium gas flow rate, and the control of the heating value are the same as those in the first embodiment, detailed explanations thereof will not be tediously made, and only different points will be explained in detail in the following. Hereinafter, the present embodiment will be explained with reference to FIG. 1.

As shown in FIG. 1, the computer 118 of the present embodiment is connected to the remote monitoring center 123 via the communication controller 121, such as a modem or LAN. The computer 118 notifies the remote monitoring center 123 of operation management information of the MRI apparatus, via the communication controller 121, whereby the MRI apparatus is remotely monitored by the remote monitoring center 123. Then, the control information from the remote monitoring center 123 is transmitted to the computer 118. Similar to the second embodiment as described above, the helium gas measuring unit 111 is controlled according to the control information from the remote monitoring center 123 via the computer 118, and the helium gas measuring unit 111 notifies the remote monitoring center 123 of a result of the measurement. More in detail, a set value of pressure is inputted from the remote monitoring center 123 in the control circuit 305 via the computer 118, and the remote monitoring center 123 is notified of a gas flow rate value from the flow rate display meter 309 via the computer 118. In addition, the heating value of the heater 212 is controlled from the remote monitoring center 123 via the computer 118.

In the configuration as described above, the remote monitoring center 123 performs the processes (remote monitoring processes) from the step 805 to step 808 of the processing flow as shown in FIG. 8 via the computer 118, repeatedly at regular intervals, and controls the control circuit 305, the flow rate display meter 309, and the heater 212. On that occasion, the gas pressure set in the control circuit 305, the gas flow rate obtained from the flow rate display meter 309, and the heating value of the heater 212 may be sequentially displayed on the display unit of the remote monitoring center 123. Then, when the coolability C of the cryo-cooler 108 is below the heat penetration amount A into the helium containers, a manager of the remote monitoring center 123 is notified of the situation as a warning. By way of example, a warning message may be displayed on the display unit and/or an alarm may be sounded. The manager of the remote monitoring center 123, who has received such alarm, immediately goes to the site of MRI apparatus, and performs maintenance or replacement of the cryo-cooler 108. On the other hand, when process form step 805 to step 808 are finished, if the coolability C of the cryo-cooler 108 exceeds the heat penetration amount A into the helium containers, a next remote monitoring process is just waited, without doing anything.

The present embodiment has been explained according to the description above. With the present embodiment, remote monitoring is performed from the remote monitoring center, and the heat penetration amount into the helium containers and the coolability of the cryo-cooler are monitored constantly for 24 hours every day all year around, without bothering the operator of the MRI apparatus, so that it is judged whether or not the overall system is operated with proper coolability. When the judgment is negative, a corrective action can be taken immediately, thereby keeping the refrigerant volume in the superconducting magnet to a stable level while performing the operation.

It is to be noted that the present embodiment can be implemented in the superconducting magnet as a single unit in the similar manner, and the same effect can be expected.

Fourth Embodiment

Next, a fourth embodiment of the present invention will be explained. The MRI apparatus, the measurement of the helium gas flow rate, and the control of the heating value of the heater in the present embodiment are basically the same as those in any of the above embodiments. However, the computer 118 of the present embodiment has functions as the following; calculating the coolability of the cryo-cooler 108 and the heat penetration amount into the helium containers 205 and 206 of the cryostats 103 and 104, determining whether or not those values are within predetermined proper ranges, and presenting a result of the determination to the operator. In the present embodiment, a difference between the coolability of the cryo-cooler 108 and the heat penetration amount into the helium containers 205 and 206 is monitored, instead of the heating value of the heater 212, in order to extract a time for maintenance and checking.

As described above, the cryostats 103 and 104 have the heat penetration amount into the helium containers 205 and 206, being different by individual systems, depending on the dimension of the heat shielding plate or the super insulator, and the installation accuracy. The cryo-cooler 108 to be incorporated also has an individual difference. Therefore, it is necessary to determine at the stage of manufacturing completion, whether or not the heat penetration amount into the helium containers 205 and 206, and the coolability of the cryo-cooler 108 are within allowable ranges. In addition, as mentioned above, due to displacements of the heat shielding plate or the super insulator during a transportation from a manufacturing site to a medical facility, within the cryostats 103 and 104, there may occur variances in the heat penetration amount into the helium containers and the coolability of the cryo-cooler 108, between the manufacturing stage and after the installation in the medial facility.

Therefore, in the present embodiment, by using the functions held by the cryostats 103 and 104 according to each of the above embodiments, for accurately measuring the helium gas flow rate vaporized from the helium containers 205 and 206, the heat penetration amount into the helium containers 205 and 206 and the coolability of the cryo-cooler 108 are calculated, at both the manufacturing stage and the installation time in the medical site. Then, it is determined whether or not a result of the calculation is within the allowable range. An operator is notified of the result of the determination by means of displaying, or the like. The operator devises a countermeasure as appropriate, based on the result of the notification.

The computer 118 of the present embodiment functions as a heat penetration amount calculation unit, a coolability calculation unit, a device status recording unit, a graph generation unit, a device status determination unit, a status monitoring controller, and an equipment tolerance judging unit.

The heat penetration amount calculating unit calculates the heat penetration amount into the helium containers 205 and 206, based on the helium gas flow rate measured by the helium gas measuring unit 111, in the same manner as in each of the above embodiments. Upon accepting from an operator a direction for calculating the heat penetration amount, or accepting a direction from the status monitoring controller, the heat penetration amount calculation unit stops the heater 212 and the cryo-cooler 108, and performs measurement according to the means of step 801 of the first embodiment, so as to calculate the heat penetration amount. If the cryo-cooler 108 is not mounted, only the heater 212 is stopped for the measurement.

The coolability calculation unit calculates the coolability of the cryo-cooler 108. The coolability of the cryo-cooler 108 corresponds to the sum of the heat penetration amount into the helium containers 205 and 206, and the heating value of the heater 212, when the heating value of the heater 212 is adjusted so that the helium gas flow rate is rendered to be zero as described above. Upon accepting a direction from the operator or accepting a direction from the status monitoring controller, the coolability calculation unit also performs the measurement of the heat penetration amount, and totalizes the result with the heating value of the heater 212, so as to calculate the coolability.

The device status recording unit receives the heat penetration amount into the helium containers 205 and 206 and the coolability of the cryo-cooler 108, which are calculated at each timing, respectively calculated by the heat penetration amount calculation unit and the coolability calculation unit, and holds the data in association with the receiving time in the recording means such as a memory. In the present embodiment, the recording is performed on a daily basis. It is further possible to configure such that recording of the time of manufacturing completion and the time of installation in the medical site may not be indicated by a date, but in association with the information that specifies the manufacturing completion time and the installation time.

The graph generation unit uses data held by the device status recording unit, and generates graph screen data for displaying a graph obtained by plotting in time series, at least one of the coolability and the heat penetration amount. Generation of the graph is performed at the timing when the data items above are stored in the device status recording unit or at the timing when a direction from the operator is accepted. As the graph screen data, the latest values of the heat penetration amount and the coolability, being displayed as the graph are displayed in the form of numerical values, together with the graph.

The device status determination unit calculates an allowance that indicates a degree of allowance of the coolability of the cryo-cooler 108, and determines whether or not there is an allowance in the coolability of the cryo-cooler. The allowance is calculated by subtracting the heat penetration amount from the coolability of the cryo-cooler 108. When a value calculated as the allowance is positive, the device status determination unit determines that the coolability has the allowance and the operation is normal, whereas the value is negative, it is determined that the coolability is insufficient. A result of the allowance calculation and a result of the determination are passed to the graph generation unit, and incorporated into the graph screen data as display information. It is to be noted that the device status determination unit calculates the allowance at a time when the data is stored in the device status recording unit.

FIG. 9 is one example of graph screen 900 that is displayed on the display device such as the display unit 120, on the basis of the graph screen data generated by the graph generation unit. The graph screen 900 is provided with a graph field 910 and a numerical value display field 920. As shown in the figure, a vertical axis of the graph displayed in the graph field 910 indicates a heat quantity represented in a unit of milliwatt (mW), and a horizontal axis thereof indicates a time (here, the unit is day). In this figure, "Cryo-Cooler" indicates the coolability of the cryo-cooler 108, and "Magnet" indicates the heat penetration amount into the helium containers 205 and 206 of the superconducting magnet. It is to be noted that the numerical value display field 920 displays latest data of the coolability of the cryo-cooler 108 and the heat penetration amount, and the allowance, in the form of numerical values. As a status display, when the allowance is a positive value, "Normal" is displayed, whereas "Warning" is displayed when the allowance is a negative value.

As shown in FIG. 10, the graph screen 900 may further be provided with a button 930 for displaying installation-time data, for accepting a direction to display the coolability and the heat penetration amount at the time of installation. Upon accepting a direction from the operator via the button 930 for displaying installation-time data in the graph screen 900, the graph generation unit displays on the graph field 910, the coolability and the heat penetration amount at the time of installation.

The status monitoring controller allows the heat penetration amount calculation unit and the coolability calculation unit to measure respectively the heat penetration amount into the helium containers 205 and 206, and coolability of the cryo-cooler 108, at predetermined time intervals. The status monitoring controller is activated when it accepts a direction from the operator, indicating that the MRI apparatus enters the operation.

The equipment tolerance judging unit judges whether or not the heat penetration amount into the helium containers 205 and 206 and the coolability of the cryo-cooler calculated in each point of time are within predetermined allowable ranges, assuming the standard data held in advance as a reference, and presents the operator a result of the determination by means of displaying or the like. As for the heat penetration amount, it is determined as being within the allowable range when the amount is equal to or less than a predetermined value, and as for the coolability, it is determined as being within the allowable range when the coolability is equal to or more than a predetermined value. The determination result includes four types; both are within the allowable ranges (normal), the heat penetration amount is out of the allowable range (heat penetration amount fault), the coolability is out of the allowable range (coolability fault), and both the heat penetration amount and the coolability are out of the allowable ranges (heat penetration amount fault and coolability fault). It is to be noted that the equipment tolerance judging unit may not be necessary. For example, it is further possible to configure such that the graph screen 900 as described above is used to display the heat penetration amount into the helium containers 205 and 206 and the coolability of the cryo-cooler, which have been calculated, on the display device or the like, and the user determines whether the values are appropriate, and a result of the determination is inputted.

It is further possible to configure such that the display of the graph screen data generated by the graph generation unit may be displayed not only on the display unit 120 directly connected to the computer 118, but also on the display device of the remote monitoring center 123 connected via the communication controller 121.

Each of the functions realized in the computer 118 described above is implemented when the CPU of the computer 118 executes the programs stored in the memory that is held by the computer 118.

Next, a work flow will be explained, from the time when the MRI apparatus according to the present embodiment is manufactured, the apparatus is transported to a medical site, installed therein, and operations are started, until the time when the maintenance and checking become necessary. FIG. 11 is diagram for explaining the work flow of the MRI apparatus according to the present embodiment.

An explanation will be made from the point of time when an operator incorporates in the MRI apparatus, a superconducting magnet as to which assembling is completed except the cryo-cooler. Firstly, the operator allows the MRI apparatus of the present embodiment to perform necessary coolability calculation process, so as to calculate the coolability necessary for the cryo-cooler to be incorporated (step 1101). The operator selects a cryo-cooler to be incorporated based on the calculation result, and incorporates the selected cryo-cooler (step 1102).

When the cryo-cooler is incorporated, the operator allows the MRI apparatus of the present embodiment to conduct a performance check at the time of manufacture (step 1131). In this case here, the coolability is calculated at the manufacturing site (step 1103). It is determined whether or not the heat penetration amount calculated at the time of coolability calculation process in step 1101, and the coolability calculated in step 1103 are within the predetermined allowable ranges (step 1104). Then, if both results are within the allowable ranges, the results of the calculation are recorded (step 1105), and the determination result is notified. On the other hand, if at least one of the heat penetration amount and the coolability is out of the allowable ranges, the determination result is notified. The notification is any one of the four types as described above.

Upon receipt of the notification indicating that at least one of the heat penetration amount and the coolability is out of the allowable range, the operator takes a countermeasure (step 1121), and gives a direction to conduct again the performance check at the time of manufacture. In step 1121, if it is judged as the heat penetration amount fault, the operator takes measures to thermally insulate the cryostat. Here, for example, displacement is repaired, which was caused by vacuum down and/or transportation. When it is judged as the coolability fault, the operator takes an action such as reincorporating the cryo-cooler. In this case here, for example, a quality of works is enhanced for securing a thermal contact between a low-temperature portion of the cryo-cooler and the heat shielding plate in the cryostat. If both are under the faulty conditions, countermeasures are taken for both.

It is further possible to configure such that when any one of the heat penetration amount and the coolability is out of the allowable ranges, the calculation result being within the allowable range is held, and after the countermeasure is taken, only the performance that was out of the range is calculated again.

In the performance check at the time of manufacture, if the heat penetration amount and the coolability are both within the allowable ranges and accepted in the checking, the operator transports the MRI apparatus to the medical site, and installs the apparatus therein (step 1106). After the installation, the operator allows the MRI apparatus of the present embodiment to conduct the performance check at the time of installation (step 1132). Here, the heat penetration amount and the coolability are calculated at the installation site (step 1107), and it is determined whether or not their performance values are within the predetermined allowable ranges (step 1108). If both are within the allowable ranges, the calculation results are recorded (step 1109), as well as being notified. On the other hand, when at least one of the heat penetration amount and the coolability is out of the allowable range, the situation is notified.

Upon receipt of the notification indicating that at least one of the heat penetration amount and the coolability is out of the allowable range, the operator takes countermeasures (step 1122), and gives a direction to conduct again the performance check at the time of installation. It is to be noted that the measures taken here are the same as those taken in the performance check at the time of manufacture.

In the performance check at the time of installation, if the heat penetration amount and the coolability are both within the allowable ranges, the operator starts the operation of the MRI apparatus (step 1110), and gives a direction to the MRI apparatus to start the status monitoring process (step 1133). Here, after every lapse of a predetermined time (step 1111), the heat penetration amount and the coolability are calculated (step 1112), and it is determined whether or not the allowance required for both is less than zero (step 1113). If the allowance is not less than zero, a graph is displayed (step 1114), the process returns to step 1111, and the next calculation time is waited. On the other hand, if the allowance becomes less than zero, the operator is informed of the situation. Upon receipt of the notification, the operator terminates the status monitoring process, and conducts maintenance and checking. It is to be noted during the operation of the MRI apparatus, the heating value of the heater is controlled also in this embodiment, similar to the first embodiment.

Next, each processing in the procedure above performed by the computer 118 of the MRI apparatus according to the present embodiment will be explained in the following.

At first, a necessary coolability calculation process in step 1101 above will be explained. FIG. 12 is a processing flow of the necessary coolability calculation process according to the present embodiment.

Upon accepting a direction from the operator to start the necessary coolability calculation process, the computer 118 allows the heat penetration amount calculation unit to calculate the heat penetration amount into the helium containers 205 and 206 (step 1201). Then, the computer 118 stores the heat penetration amount being calculated into the memory, and calculates the coolability necessary for the cryo-cooler according to the method of the first embodiment (step 1202). The computer 118 presents the result to the operator (step 1203), and terminates the processing. In the present embodiment, it is configured such that the calculation of the coolability necessary for the cryo-cooler to be incorporated is carried out by the computer 118, but the configuration is not limited to this example. By way of example, it is further possible to configure such that the heat penetration quantity calculated by the heat penetration amount calculation unit is presented to the operator, and the operator calculates the coolability necessary for the cryo-cooler to be incorporated.

Next, explanations will be made as to the performance check at the time of manufacture in step 1131 and the performance check at the time of installation in step 1132. Since these check processes are almost the same, both are assumed as a performance check before starting operation, and will be explained as the following. FIG. 13 is a processing flow of the performance check before starting operation according to the present embodiment.

Upon accepting a direction from the operator to start the performance check before starting the operation, the computer 118 allows the heat penetration amount calculation unit and the coolability calculation unit to calculate the heat penetration amount and the coolability, respectively (steps 1301 and 1302). After the calculation is completed, the computer 118 allows the equipment tolerance judging unit to judge whether or not the heat penetration amount and the coolability are within the allowable ranges (step 1303). It is to be noted that in the performance check at the time of manufacture, the calculation of the heat penetration amount by the heat penetration amount calculation unit in step 1301 is not carried out. Instead, the heat penetration amount held in the memory at the time of coolability calculation processing is used to make the determination of step 1303.

If the result of the determination of step 1303 indicates that both the heat penetration amount and the coolability are within the allowable ranges, the computer 118 allows the device status recording unit to record the calculation result (step 1304), and allows the graph generation unit to generate graph screen data, so as to display the data (step 1305). In step 1304, when the recording is performed at the time of manufacture, it is associated with the information indicating that the recording is performed at the time of manufacture, and when the record is made at the time of installation, it is associated with the information indication that the recording is performed at the time of installation. It is further possible to configure such that the result of the determination of the equipment tolerance judging unit is displayed in the graph screen data.

On the other hand, when the result of the determination of step 1303 indicates at least one of the heat penetration amount and the coolability is out of the allowable range, the computer 118 allows the equipment tolerance judging unit to display the result of the determination (step 1306). The operator can determine whether or not it is necessary to take a countermeasure through the result on the display unit.

It is to be noted that if the configuration does not include the equipment tolerance judging unit, the process of step 1303 and the process of step 1306 are not carried out. It is further possible to configure such that the process of step 1301 is carried out also in the performance check at the time of manufacture.

Next, the status monitoring process of step 1133 will be explained. FIG. 14 is a process flow of the performance check after starting the operation according to the present embodiment.

Upon receipt of the direction from the operator to start the status monitoring process, the computer 118 activates the status monitoring controller (step 1401). After a lapse of predetermined time from the receipt of the direction, the status monitoring controller allows the heat penetration amount calculation unit and the coolability calculation unit to calculate the heat penetration amount and the coolability, respectively (steps 1402 and 1403). It is further possible to configure such that the calculation of the heat penetration amount and the coolability are performed upon getting to a predetermined clock time.

After the calculation is finished, the status monitoring controller makes the device status determination unit to calculate an allowance (step 1404), and also makes the device status recording unit to record the heat penetration amount, the coolability, and the allowance, together with the information specifying the calculation clock time (step 1405). Further as for the calculation result, if the allowance is equal to or more than zero (step 1406), the status monitoring controller allows the graph generation unit to generate graph screen data, and display the data (step 1408). On the other hand, if the allowance is less than zero, the status monitoring controller allows the graph generation unit to generate the display data indicating that maintenance and checking are necessary, and display the data (step 1407). Here, in the graph screen data, the status being "Warning" is displayed. If a direction of termination from the operator is not received (step 1409), counting of the predetermined time is reset, and the process returns to step 1401.

As discussed above, according to the present embodiment, the helium gas flow rate vaporizing from the upper and lower containers can be accurately measured, and by using the flow rate, the heat penetration amount into the cryostat can be calculated immediately and accurately. Therefore, by calculating the heat penetration amount into the cryostat while the heater is stopped, the heat penetration amount (base heat penetration amount) into the cryostat due to conduction or radiation is calculated immediately and accurately, and presented to the manufacturer. On the basis of the base heat penetration amount being obtained, the manufacturer is allowed to select easily a cryo-cooler having sufficient coolability necessary for individual MRI apparatus, when it is installed.

Further, according to the present embodiment, since the helium gas flow rate vaporized from the upper and lower helium containers can be measured accurately, it is possible to control the heating value of the heater by the use of the flow rate. The control of the heating value of the heater enables balancing of the heat penetration amount and the coolability when the MRI apparatus is activated, whereby the consumption of the refrigerant can be suppressed.

Further, in the present embodiment, according to the heat penetration amount into the cryostat calculated from the helium gas flow rate, and the heating value of the heater, it is possible to calculate the coolability of the cryo-cooler under the condition that the cryostat is incorporated, in other words, the coolability of the overall system including the cryostat. Therefore, with a simple configuration such as having only one helium gas flow measuring unit, both the heat penetration amount and the coolability can be obtained immediately.

According to the present embodiment, it is possible to obtain the heat penetration amount and the coolability immediately as described above. Therefore, by using such data, the coolability immediately after incorporating the cryo-cooler can be calculated and presented to the operator. This result enables the operator to judge a quality of the cryo-cooler installation works at the site.

In addition, according to the present embodiment, it is possible to obtain the heat penetration amount and the coolability immediately as described above. Therefore, by using such data, the heat penetration amount and coolability at the time of installation can be calculated and presented to the operator. Accordingly, the operator is allowed to judge a trouble during transportation and a quality of installation works. It is further possible to configure such that the reference values of the judgment by the equipment tolerance judging unit after installation in a medical site correspond to the heat penetration amount and coolability at the time of manufacture. In this case, a difference between the manufacturing time and the installation time is made distinctive, whereby the trouble during transportation and the quality of installation works can be judged clearly.

In addition, according to the present embodiment, it is possible to obtain the heat penetration amount and the coolability immediately as described above. Therefore, after the start of the operation, it is possible to easily calculate the heat penetration amount and the coolability at predetermined regular intervals. Further, according to the present embodiment, the calculation result is displayed as a graph indicating variations of the heat penetration amount and the coolability along with the lapse of the operation time, and therefore, the operator is able to know target timing when maintenance is required.

From this graphic display, the operator is allowed to know easily, variations of the heat penetration amount caused by eddy current and vibrations occurring in the superconducting magnet due to an examination (scanning), and variations caused by the weather. Usually, there are no other factors that exert influences on the heat penetration amount variations, except the examination (scanning) and the weather. Therefore, if there is shown any variation more than the variation caused by such influences usually understood, the operator is able to determine based on the graph that there is a deterioration in a property of the heat shielding, such as deterioration of vacuum level of the superconducting magnet, and it is possible to know ahead of time, that a fault may occur in the system.

In the present embodiment, it is configured such that the heat penetration amount and the coolability at the time of installation can also be displayed in the form of graph. Therefore, a difference compared to the time of installation can be clearly shown for the operator. The operator can grasp the operating state and environment of the system more easily, and take necessary countermeasures ahead of time.

Instead of displaying the heat penetration amount and the coolability at the time of installation, those values at the time of manufacturing completion may be displayed. Displaying of the heat penetration amount and the coolability at the time of manufacturing completion enables the operator for the installation works to grasp easily, variations in the apparatus during the transportation and the state of the apparatus after the installation. It is further possible to configure such that the values at the time of manufacturing completion are held in the memory before the installation, and after the installation completion, the values at the time of manufacturing completion are written over by the values at the time of installation. In the area of the memory, it is further possible to hold the data at a specific point of time, other than the manufacturing completion time and the installation time. Another configuration may be possible such as holding and displaying not only the values at one point of time, but the values at multiple points of time (e.g., manufacturing completion time and installation completion time).

In the present embodiment, a degree of allowance of the coolability is calculated based on the heat penetration amount and the coolability being calculated, and presents the degree of allowance together with the above graph and the information indicating the state of the cryostat. Therefore, the operator is allowed to know intuitively the necessity of the maintenance and checking of the cryo-cooler.

According to the present embodiment, it is possible to configure such that the computer automatically calculates the heat penetration amount and the coolability after starting the operation, and displays the results. Therefore, the heat penetration amount and the coolability of the cryo-cooler are balanced, establishing an operation with an optimized consumption of the refrigerant, without involving the operator, while the operator is allowed to know the timing of maintenance and checking.

According to the present embodiment, it is possible to notify the remote site of the calculation result and the like of the heat penetration amount and the coolability after starting the operation, which is automatically performed by the computer. Therefore, the heat penetration amount and the coolability of the cryo-cooler are balanced, establishing an operation with an optimized consumption of the refrigerant, without involving the operator and monitoring person at the remote site, while not only the operator but also the monitoring person at the remote site are allowed to know the timing of maintenance and checking.

In the present embodiment, a difference between the coolability of the cryo-cooler 108 and the heat penetration amount into the helium containers 205 and 206 is monitored, and presents the timing of maintenance and checking to the operator. However, similar to each of the first to the third embodiments, it is further possible to configure such that the heating value of the heater 212 is monitored, thereby determining the timing, and presenting the information to the operator.

DENOTATION OF REFERENCE NUMERALS

Figure 1:
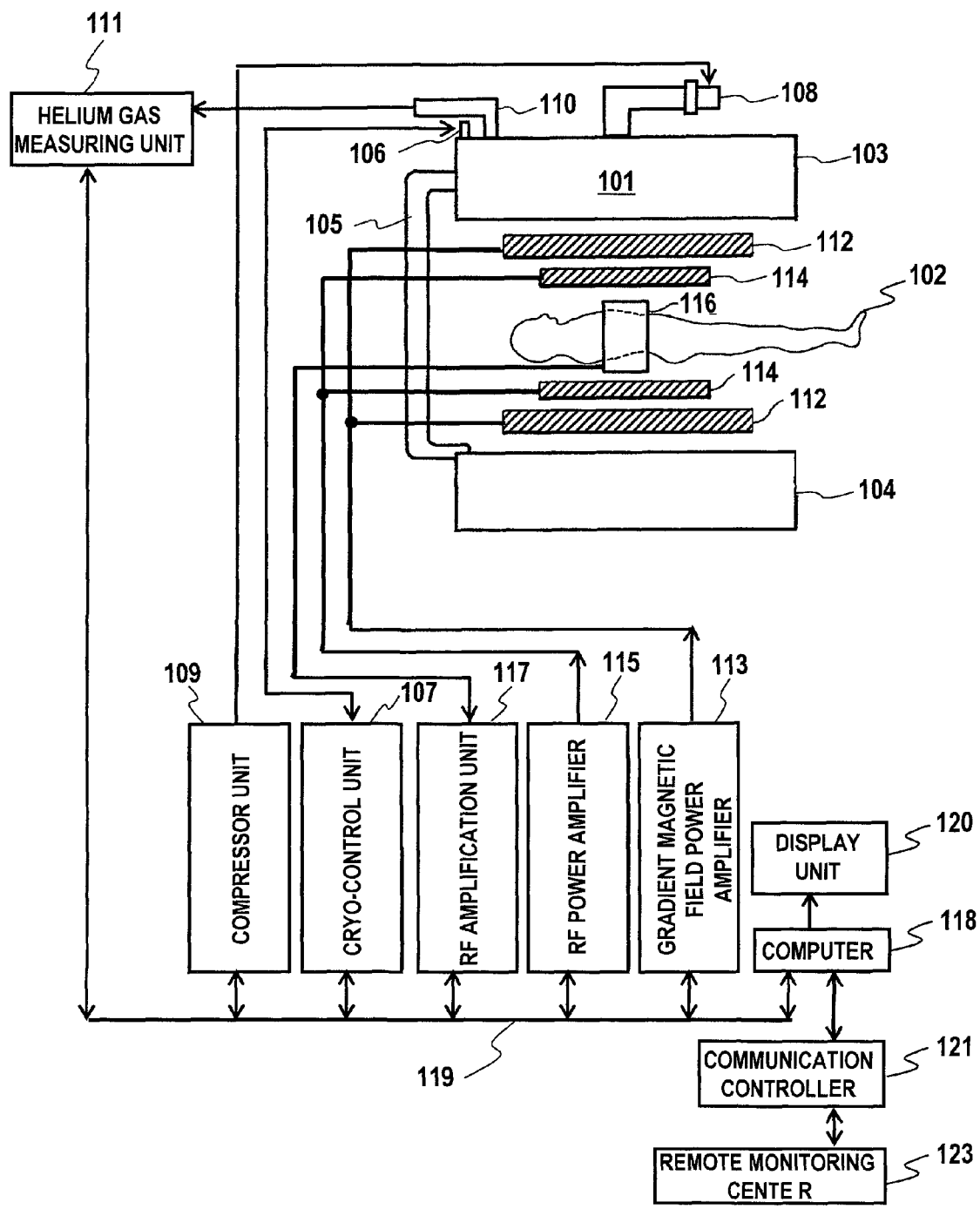
FIG. 1 is a block diagram showing an overall configuration of the open MRI apparatus according to the present embodiment.
Figure 2:
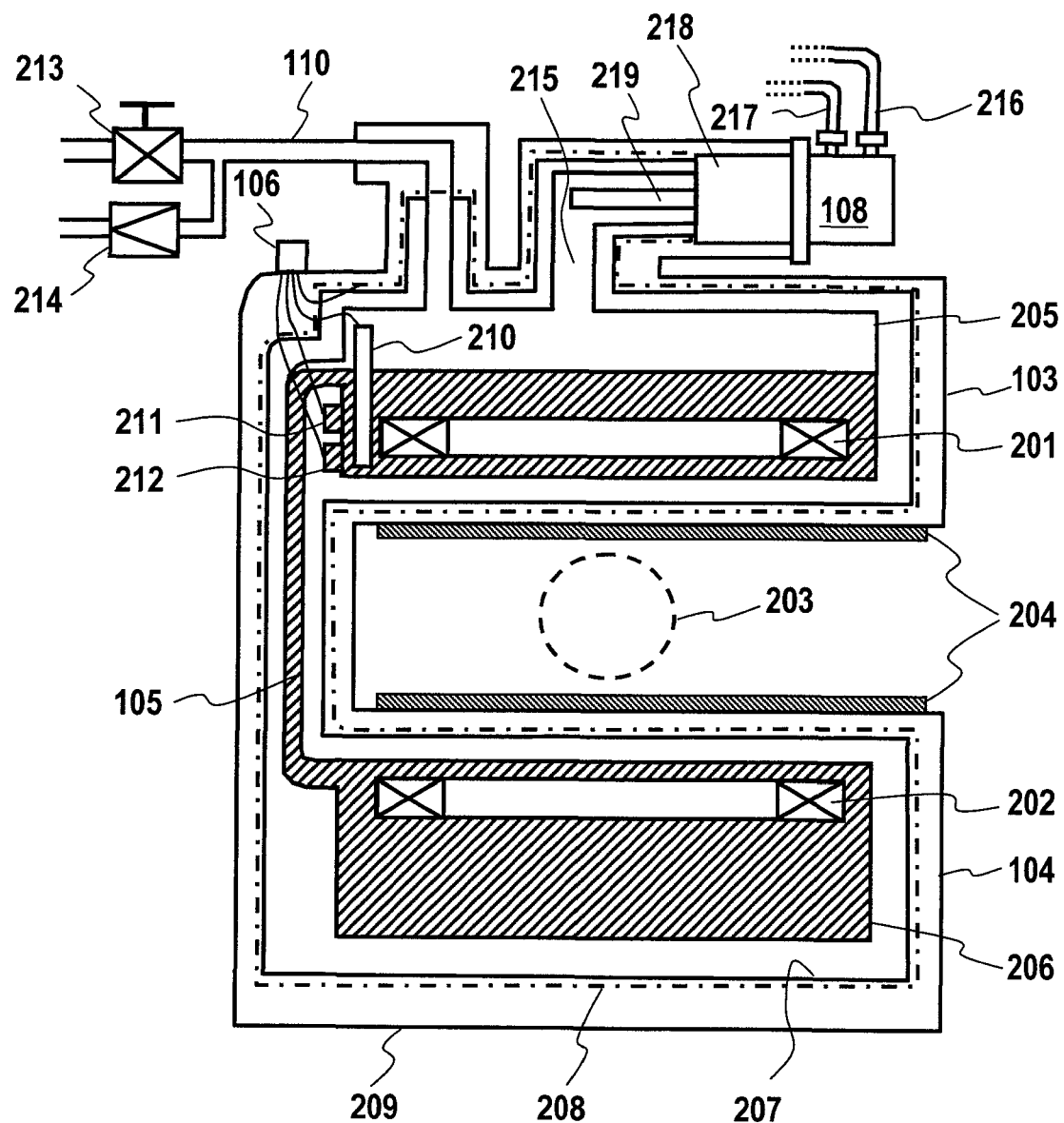
FIG. 2 illustrates a schematic configuration of a cross section of the superconducting magnet that constitutes the MRI apparatus as shown in FIG. 1.
Figure 3:
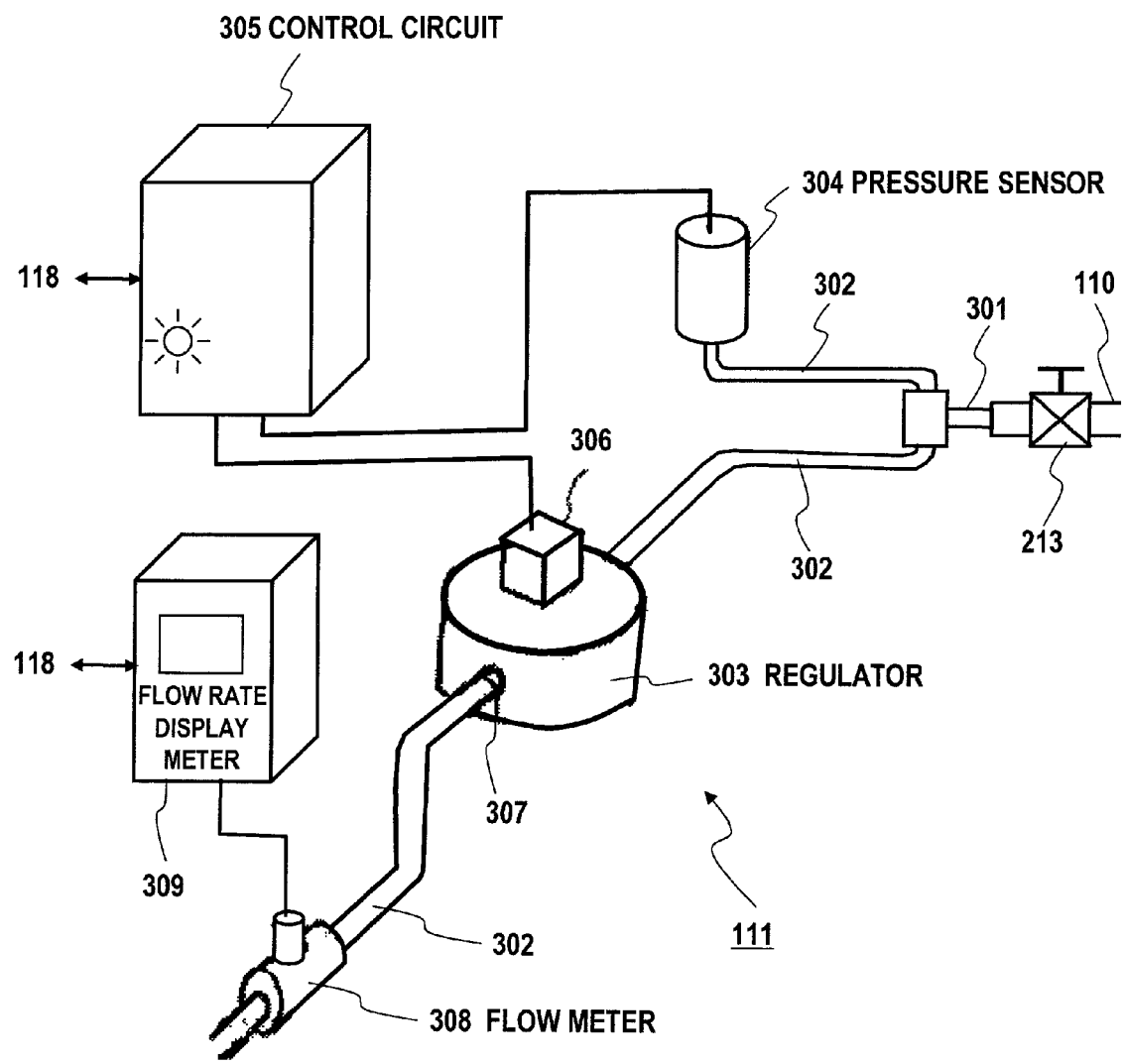
FIG. 3 is a detailed configuration diagram of the helium gas measuring unit of the MRI apparatus as shown in FIG. 1.
Figure 4:
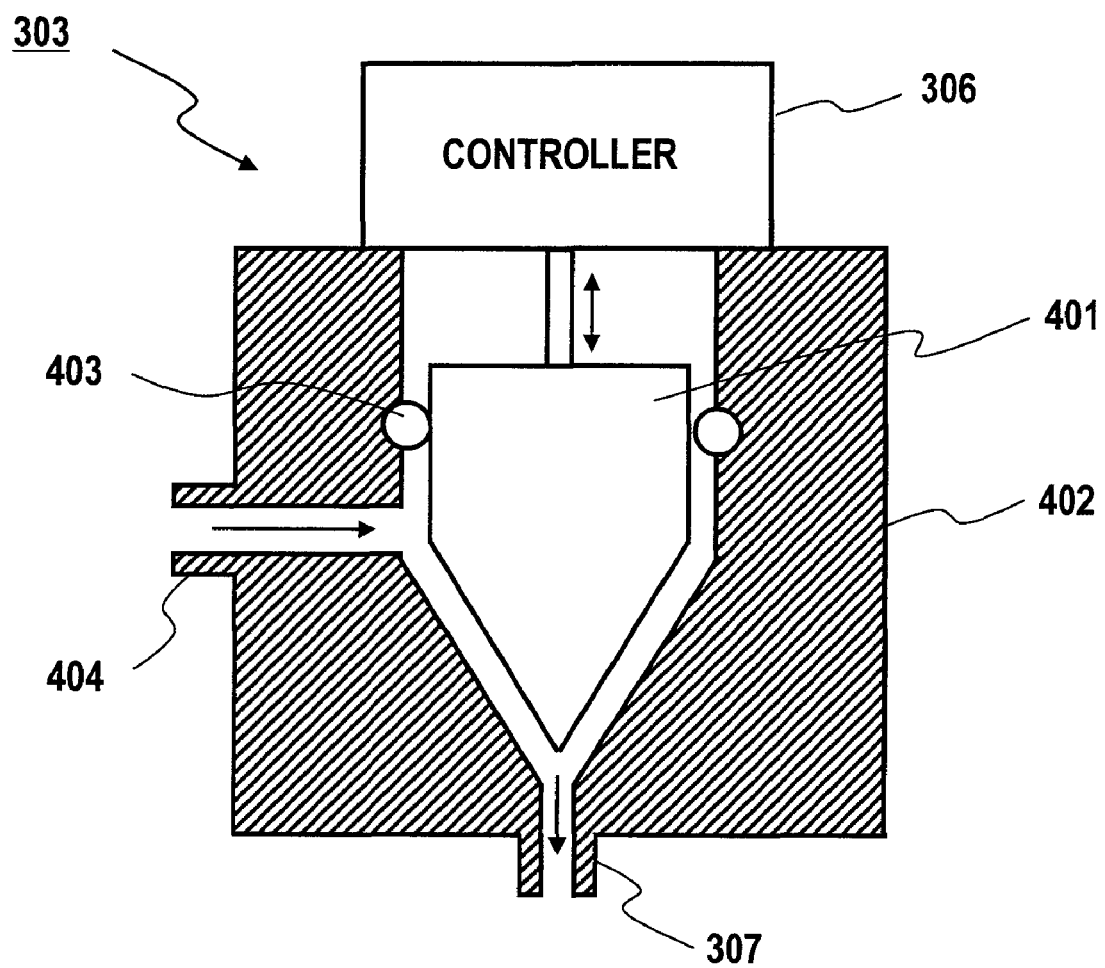
FIG. 4 illustrates an inner structure of the regulator as shown in FIG. 3.
Figure 5:
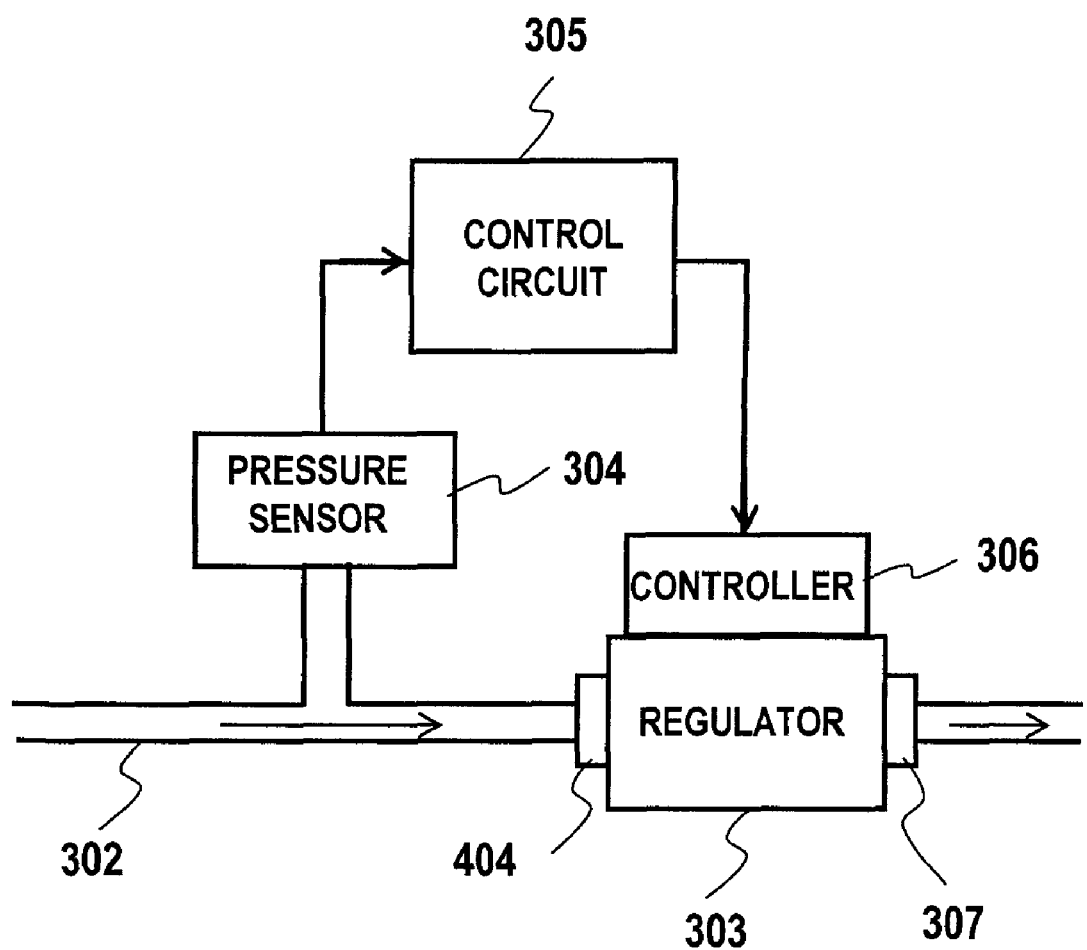
FIG. 5 illustrates an operation of the helium gas measuring unit as shown in FIG. 3.
Figure 6:
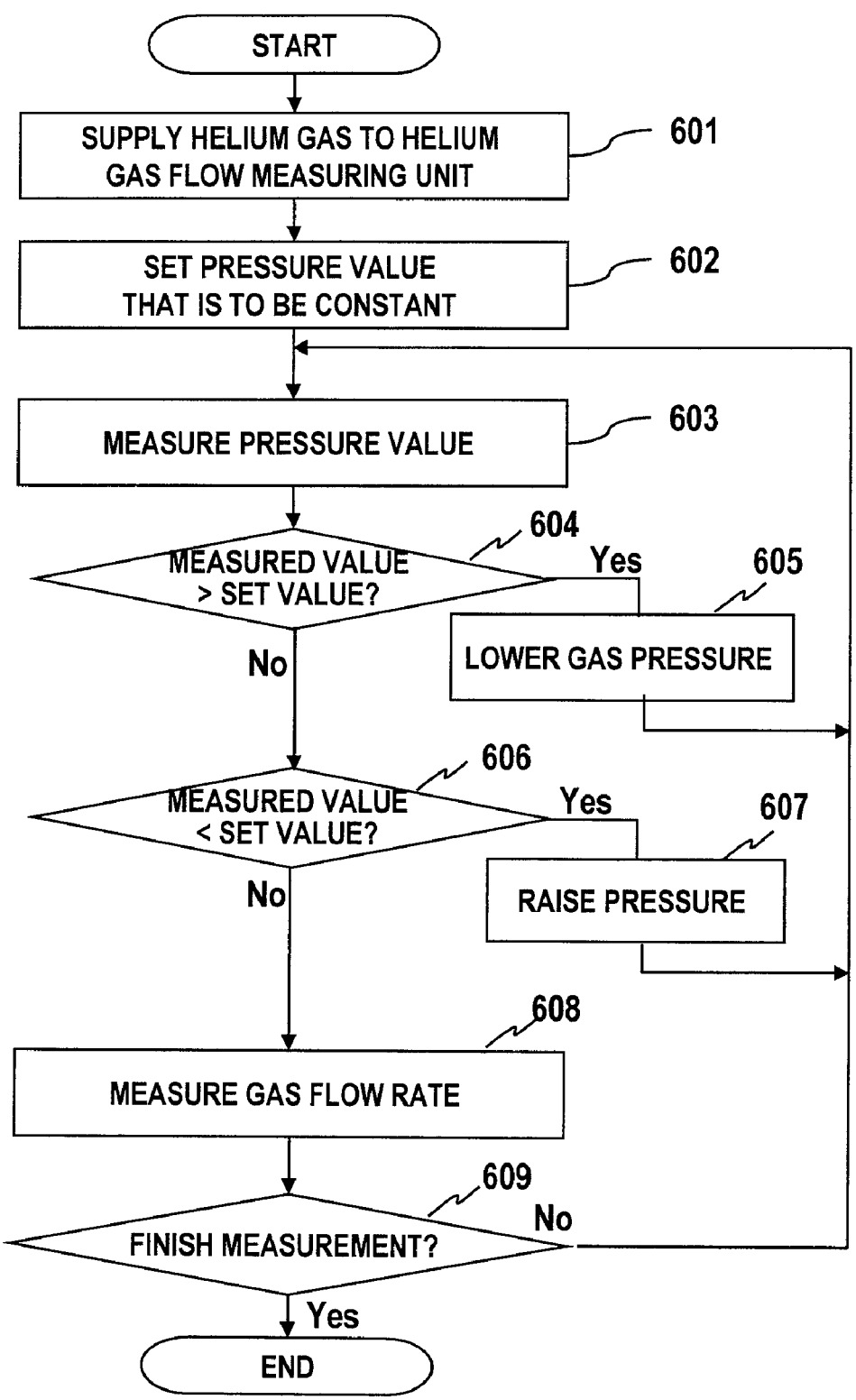
FIG. 6 is a flow chart showing a control flow for measuring the helium gas flow rate, while controlling the helium gas pressure to a constant level.
Figure 7:
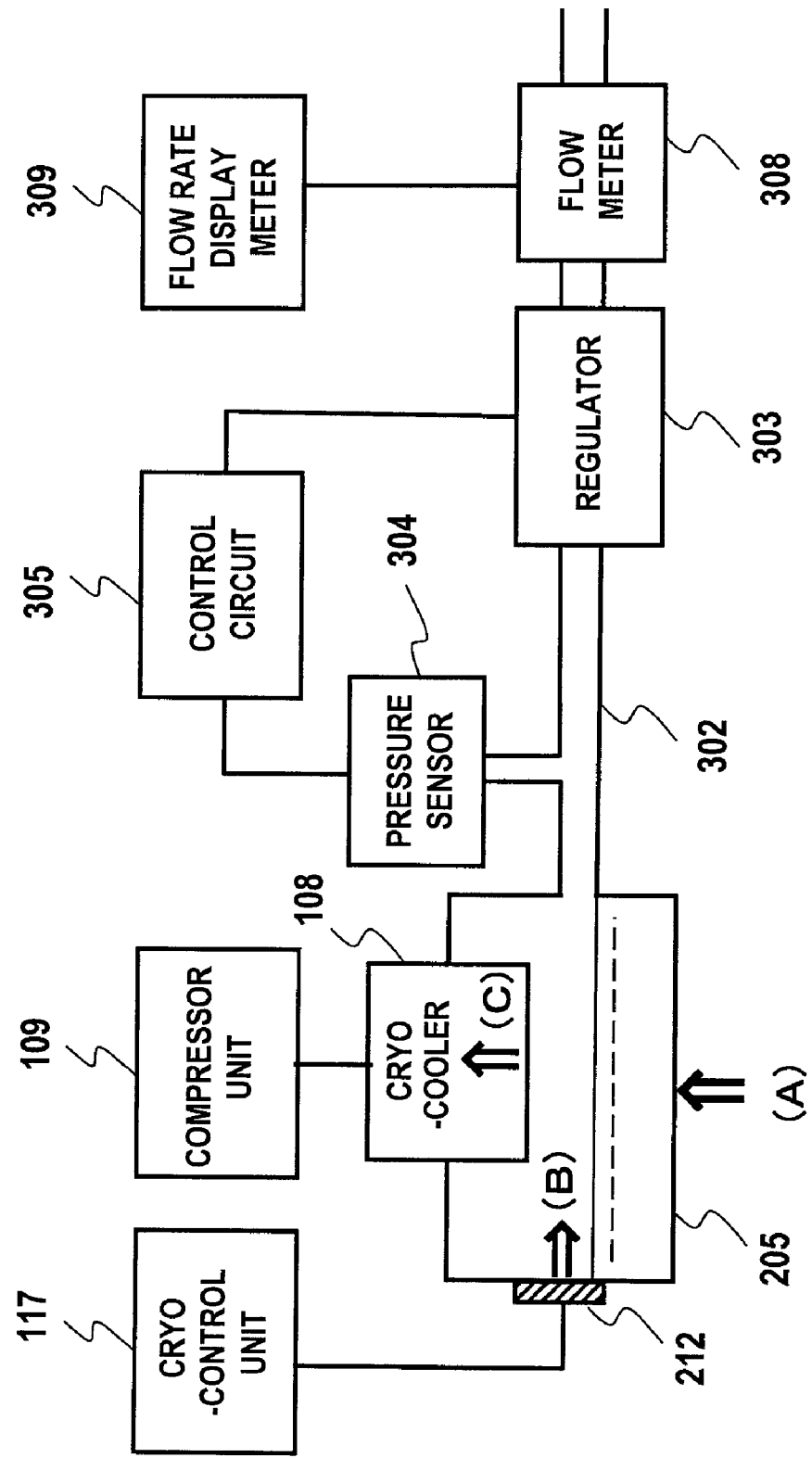
FIG. 7 illustrates functions for measuring helium in the MRI apparatus as shown in FIG. 1.
Figure 8:
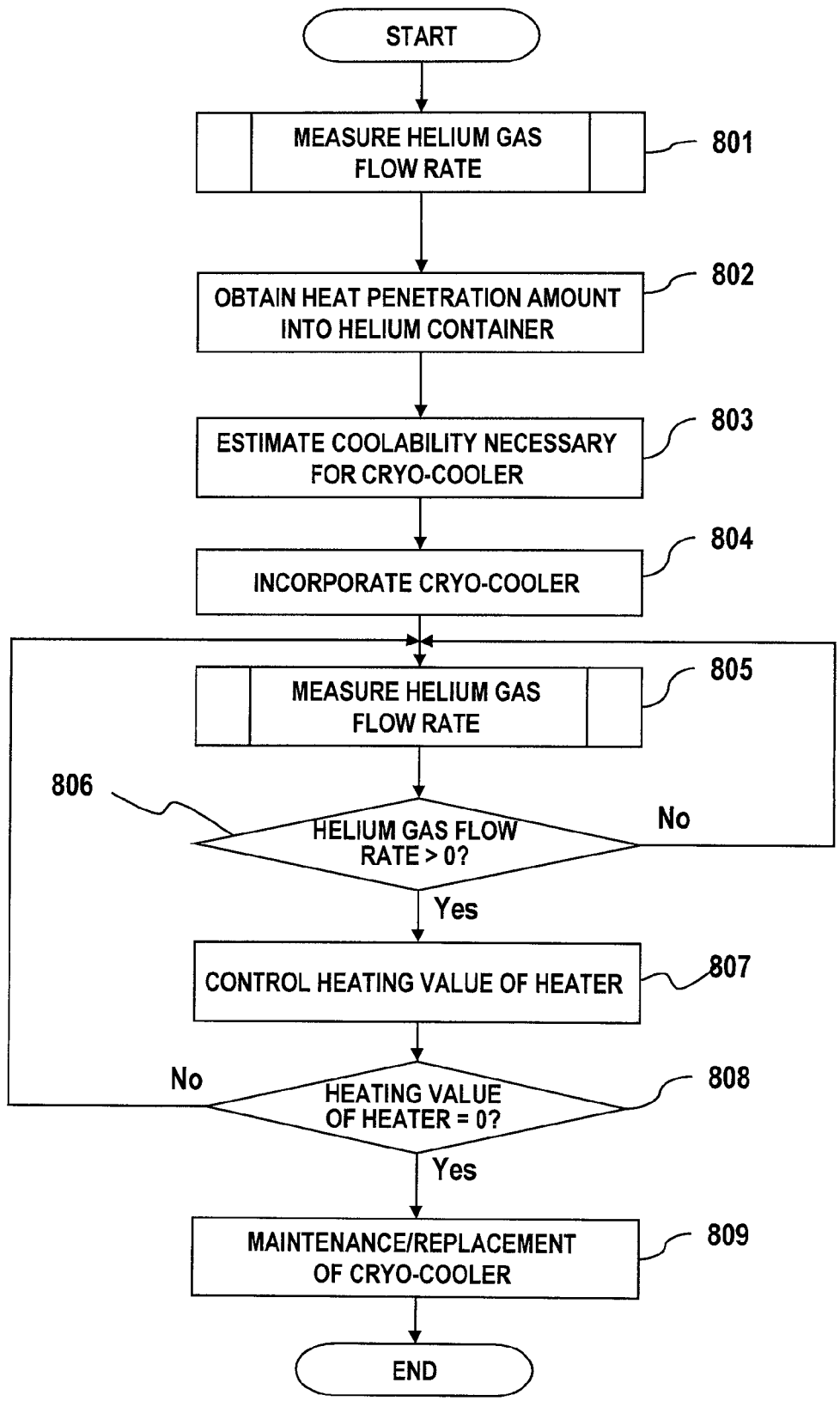
FIG. 8 is a flow chart representing a processing flow for estimating coolability necessary for the cryo-cooler.
Figure 9:
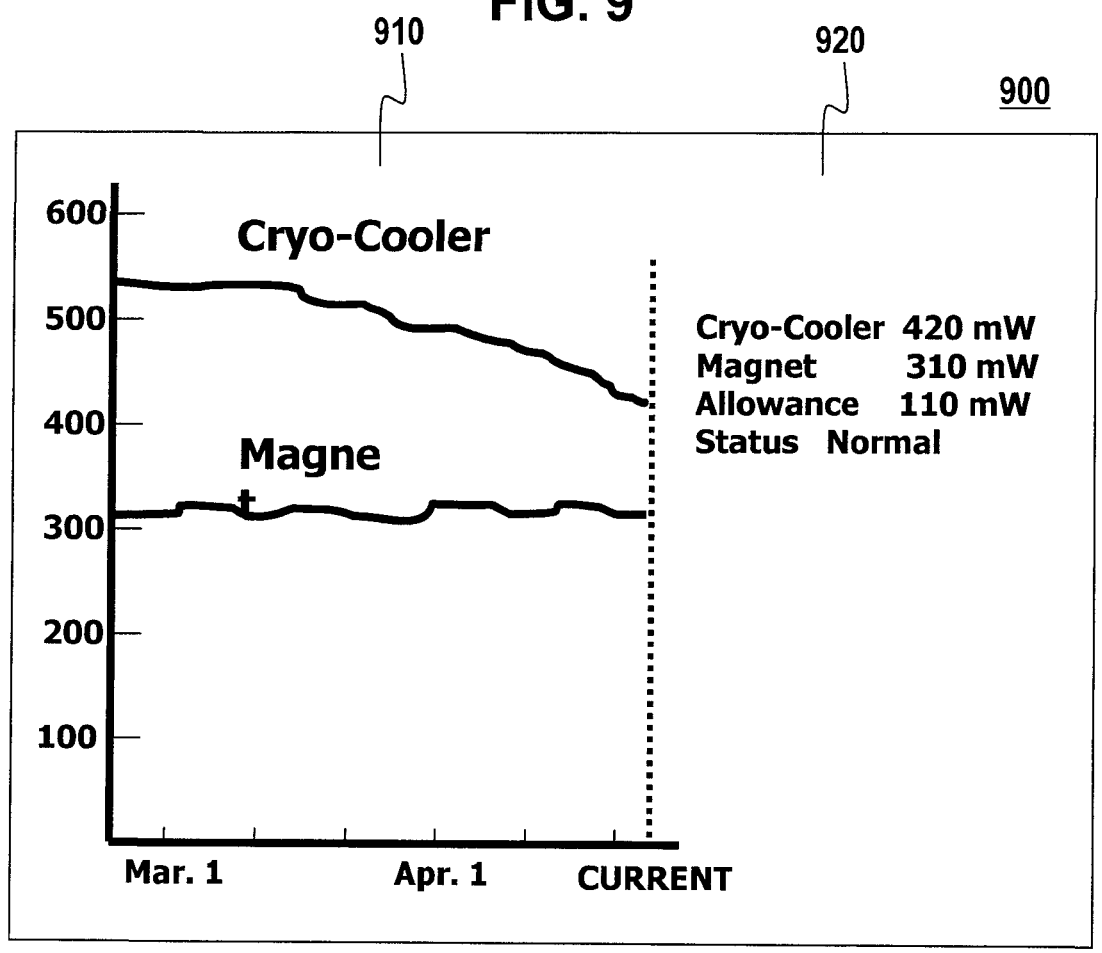
FIG. 9 is a chart showing an example of the graph screen according to the fourth embodiment.
Figure 10:
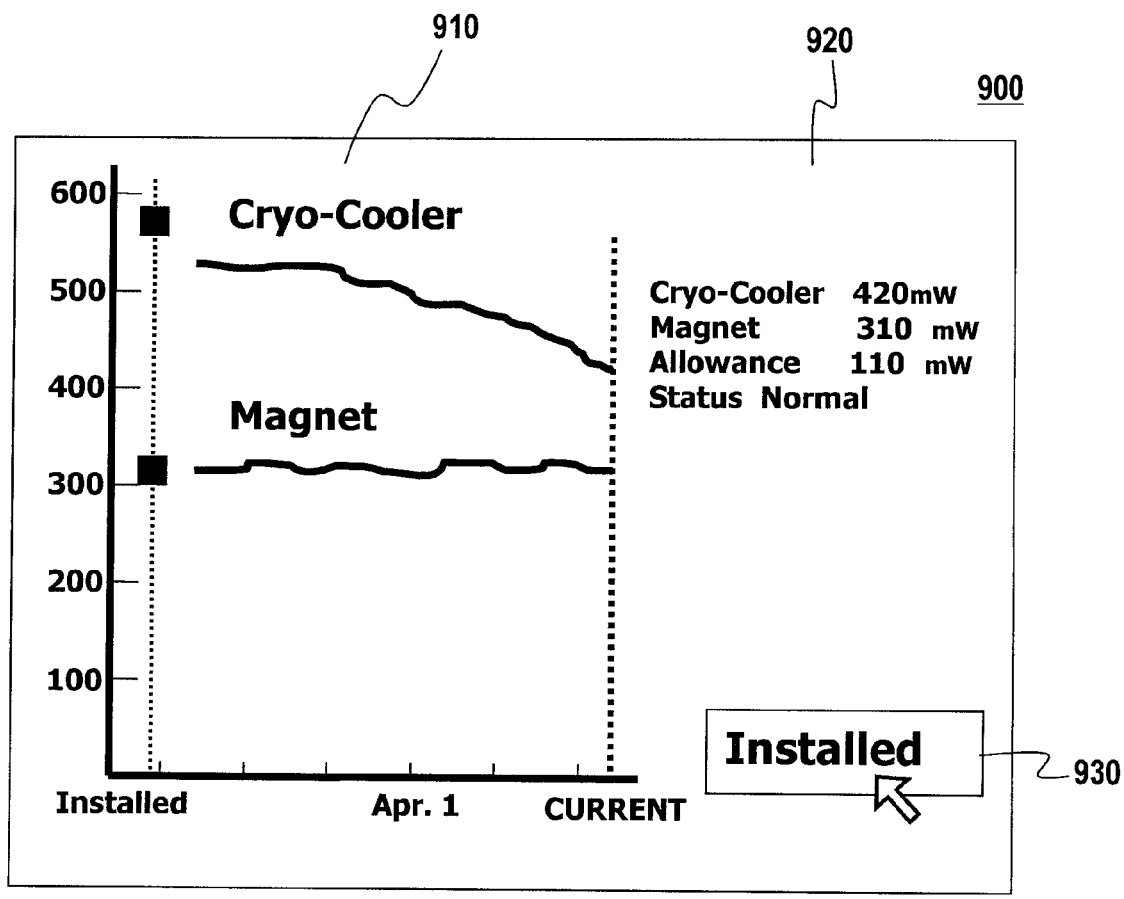
FIG. 10 is a chart showing another example of the graph screen according to the fourth embodiment.
Figure 11:
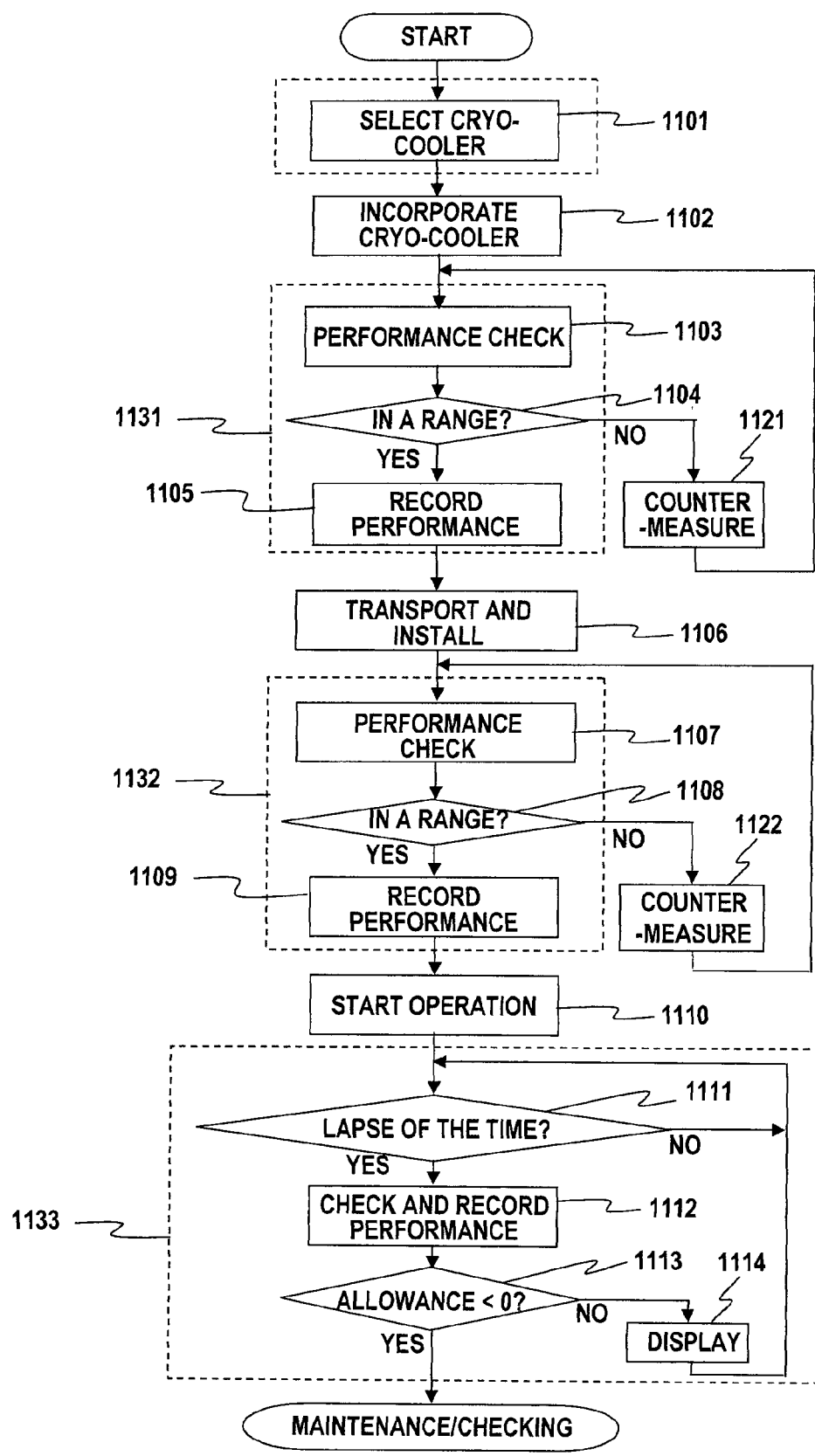
FIG. 11 is a chart to explain the work flow according to the fourth embodiment.
Figure 12:
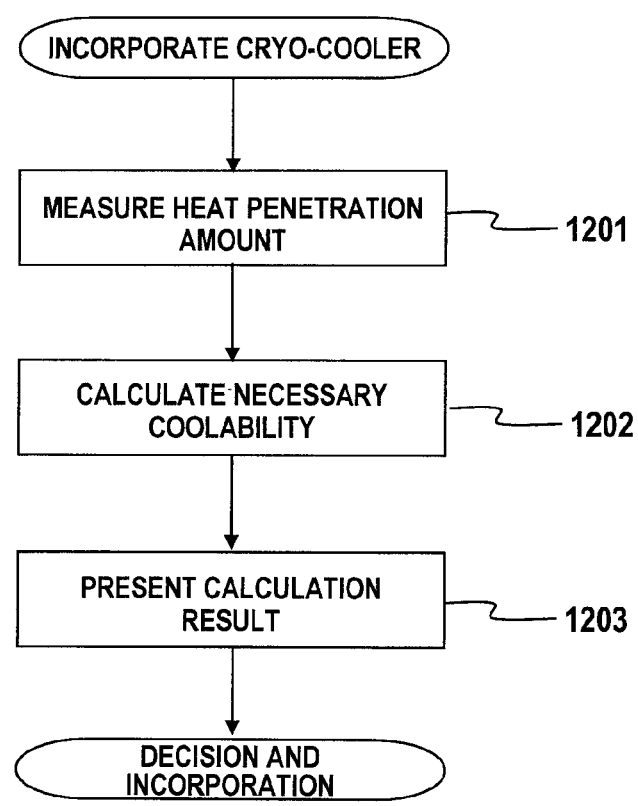
FIG. 12 is a processing flow chart of the necessary coolability calculation process according to the fourth embodiment.
Figure 13:
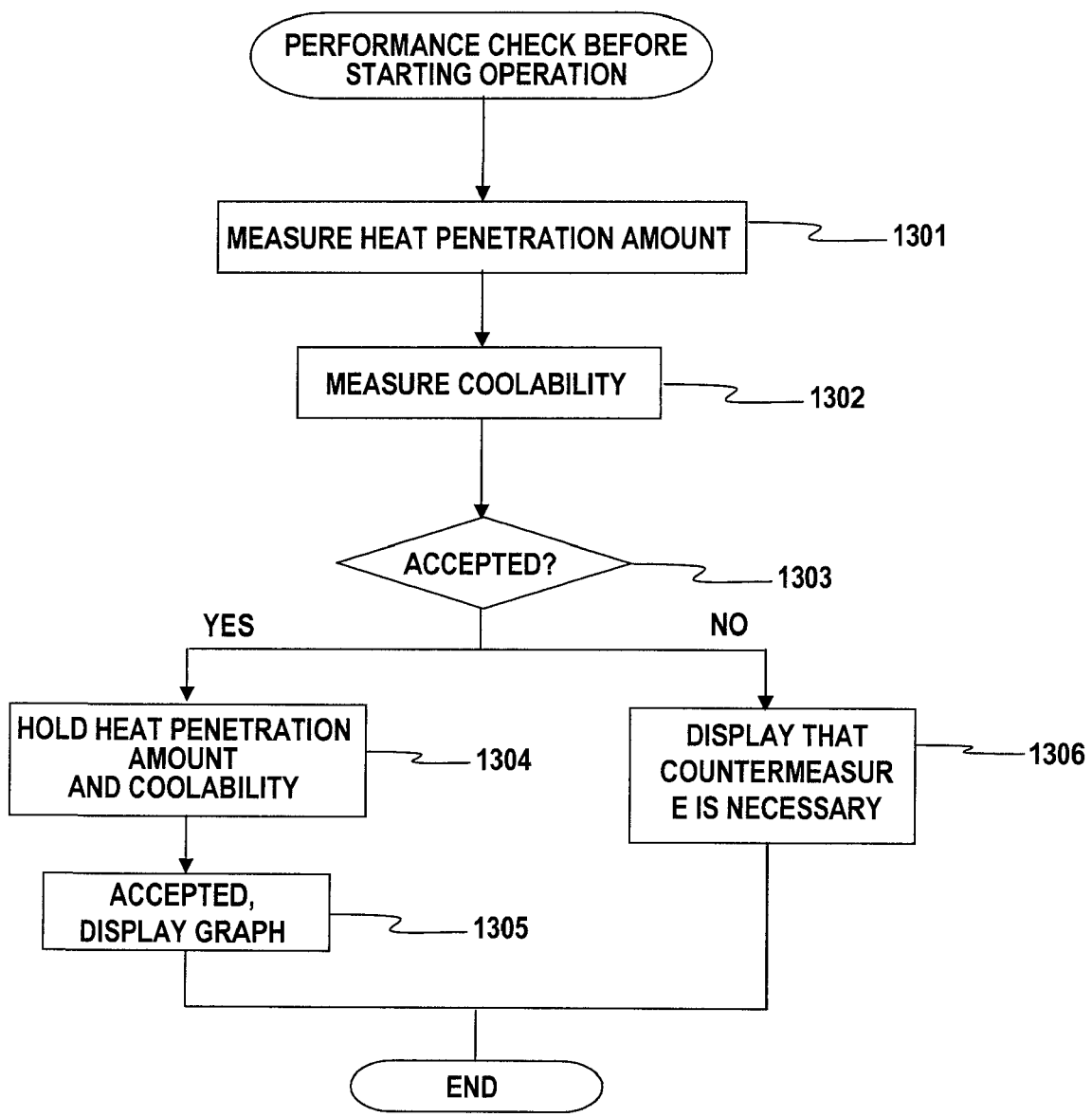
FIG. 13 is a processing flow chart of the performance check process before the operation is started according to the fourth embodiment.
Figure 14:
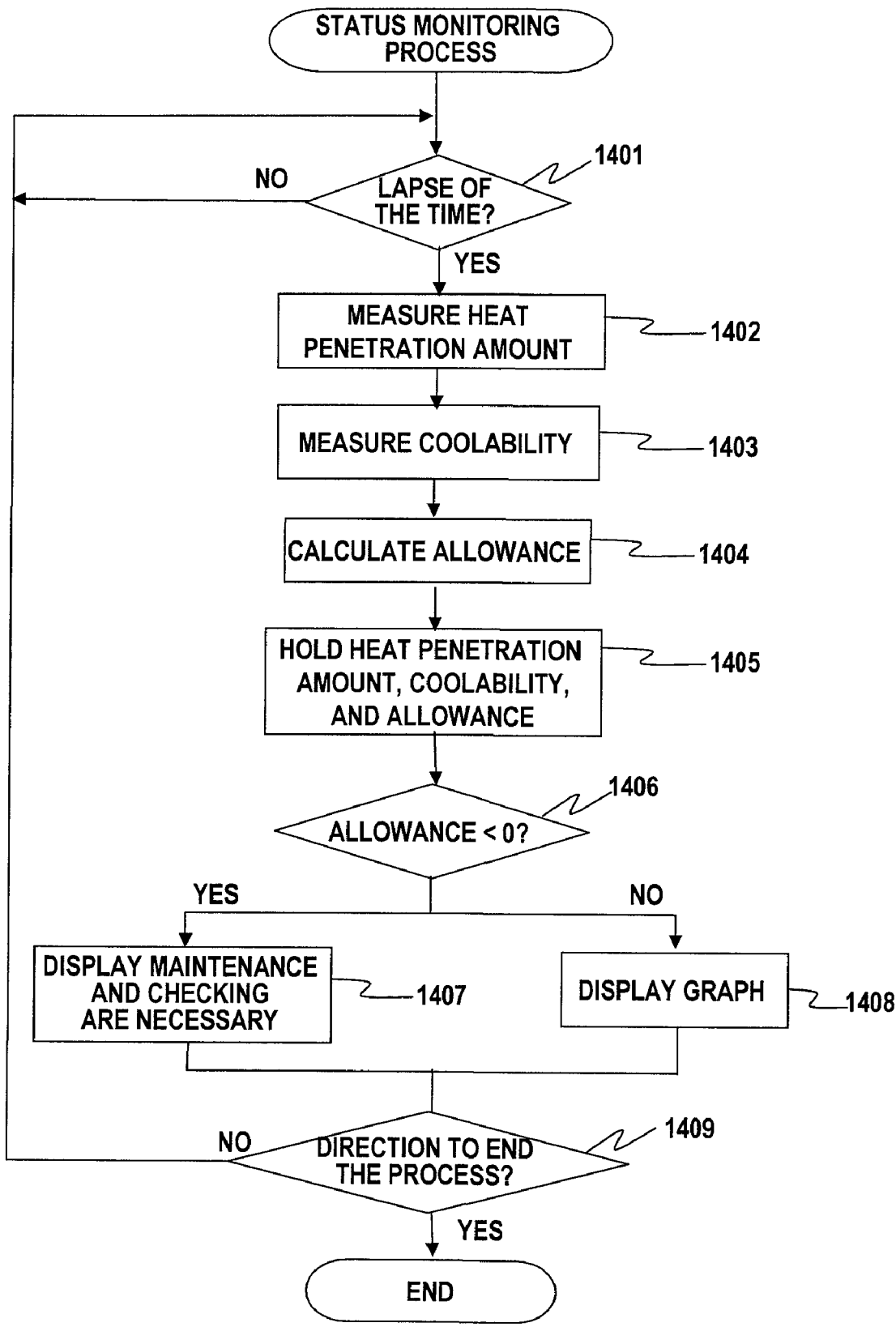
FIG. 14 is a processing flow chart of the performance check process after the operation is started according to the fourth embodiment.

101: SUPERCONDUCTING MAGNET, 108: 4K CRYO-COOLER, 111: HELIUM GAS MEASURING UNIT, 118: COMPUTER, 212: HEATER, 303: REGULATOR, 304: PRESSURE SENSOR, 308: FLOW METER

What is claimed is:

1. A magnetic resonance imaging apparatus comprising a superconducting magnet which has a cryostat involving a superconducting coil for generating a static magnetic field and a refrigerant to cool the superconducting coil, a cryo-cooler being incorporated in the cryostat for recondensing the refrigerant being vaporized, a heater for providing heat to the cryostat, and a pipe for discharging gas vaporized from the refrigerant to the outside, wherein, the magnetic resonance imaging apparatus further comprises a heating value controller for controlling a heating value of the heater so as to reduce discharging amount of the gas, based on a gas flow rate having been measured by a gas flow measuring device being connected to the pipe, the gas flow measuring device controlling the gas flowing in the pipe to be at a constant pressure to measure the gas flow rate.

2. The magnetic resonance imaging apparatus according to claim 1, further comprising, a heat penetration amount calculation unit for calculating a heat penetration amount into the cryostat, based on the gas flow rate measured by the gas flow measuring device, wherein, the heating value controller controls the heating value of the heater so as to balance a sum of the heat penetration amount into the cryostat and the heating value of the heater, with coolability of the cryo-cooler.

3. The magnetic resonance imaging apparatus according to claim 2, wherein, the gas flow measuring device measures the gas flow rate at predetermined intervals, and the heating value controller controls the heating value of the heater in association with variations of the gas flow rate.

4. The magnetic resonance imaging apparatus according to claim 3, further comprising a notifying unit, wherein, the heating value controller monitors the heating value of the heater, and when the heating value becomes equal to or less than a predetermined threshold, the notifying unit notifies that the heating value has become equal to or less than the predetermined threshold.

5. The magnetic resonance imaging apparatus according to claim 3, further comprising, a notifying unit, a coolability calculation unit for calculating the coolability necessary for the cryo-cooler, using the heat penetration amount into the cryostat, being calculated by the heat penetration amount calculation unit, and a determination unit for determining whether or not the heat penetration amount calculated by the heat penetration amount calculation unit and the coolability calculated by the coolability calculation unit are respectively within predetermined allowable ranges, wherein, the notifying unit notifies a determination result of the determination unit.

6. The magnetic resonance imaging apparatus according to claim 5, further comprising a calculation result holding unit for holding the heat penetration amount and the coolability respectively calculated by the heat penetration amount calculation unit and the coolability calculation unit, in association with the each calculation clock time, wherein, the notifying unit makes a notification by displaying in time series at least one of the heat penetration amount and the coolability held in the calculation result holding unit.

7. The magnetic resonance imaging apparatus according to claim 5, further comprising an allowance calculation unit for subtracting the heat penetration amount calculated by the heat penetration calculation unit from the coolability calculated by the coolability calculation unit, so as to calculate an allowance of the cryo-cooler, wherein, the notifying unit notifies the allowance calculated by the allowance calculation unit.

8. The magnetic resonance imaging apparatus according to claim 1, wherein, the gas flow measuring device comprising, a pressure meter for measuring a pressure of the gas within the pipe, a flow rate controller for controlling a flow rate of the gas within the pipe so that the pressure measured by the pressure meter is made constant, a flow meter for measuring the flow rate of the gas within the pipe after controlled by the flow rate controller, and a gas flow rate outputting unit for outputting a measuring result measured by the flow meter.

9. The magnetic resonance imaging apparatus according to claim 2, further comprising a coolability calculation unit for calculating the coolability necessary for the cryo-cooler, by using the heat penetration amount into the cryostat, being calculated by the heat penetration amount calculation unit.

10. The magnetic resonance imaging apparatus according to claim 9, the heat penetration amount calculation unit calculates the heat penetration amount based on the gas flow rate measured by the gas flow measuring device, without cooling by the cryostat and heating by the heater, and the coolability calculation unit calculates coolability necessary for the cryo-cooler, so that the coolability exceeds the heat penetration amount calculated by the heat penetration amount calculation unit.

11. A superconducting magnet comprising a cryostat involving a superconducting coil for generating a static magnetic field and a refrigerant to cool the superconducting coil, a cryo-cooler being incorporated in the cryostat for recondensing the refrigerant being vaporized, a heater for providing heat to the cryostat, and a pipe for discharging gas vaporized from the refrigerant to the outside, wherein,
the superconducting magnet further comprises a heating value controller for controlling a heating value of the heater so as to reduce discharging amount of the gas, based on a gas flow rate measured by a gas flow measuring device being connected to the pipe, the gas flow measuring device controlling the gas flowing in the pipe to be at a constant pressure to measure the gas flow rate.

12. The superconducting magnet according to claim 11, further comprising,
a heat penetration amount calculation unit for calculating a heat penetration amount into the cryostat, based on the gas flow rate measured by the gas flow measuring device, wherein,
the heating value controller controls the heating value of the heater so as to balance a sum of the heat penetration amount into the cryostat and the heating value of the heater, with the coolability of the cryo-cooler.

13. A refrigerant evaporation reducing method for reducing evaporation of a refrigerant in a magnetic resonance imaging apparatus including a superconducting magnet having a cryostat involving a superconducting coil for generating a static magnetic field and a refrigerant to cool the superconducting coil, a cryo-cooler being incorporated in the cryostat for recondensing the refrigerant being vaporized, a heater for providing heat to the cryostat, and a pipe for discharging gas vaporized from the refrigerant to the outside, the refrigerant evaporation reducing method comprising,
a step for measuring a pressure of the gas of the refrigerant flowing in the pipe,
a step for controlling a flow rate of the gas of the refrigerant in the pipe so as to render the pressure of the gas being measured to be at a predetermined level,
a step for measuring a gas flow rate flowing in the pipe, and
a step for controlling a heating value of the heater based on the gas flow rate being measured.

14. A coolability calculation method for calculating coolability necessary for a cryo-cooler in a magnetic resonance imaging apparatus including a superconducting magnet having a cryostat involving a superconducting coil for generating a static magnetic field and a refrigerant to cool the superconducting coil, a cryo-cooler for recondensing the refrigerant being vaporized, and a pipe for discharging gas vaporized from the refrigerant, the coolability calculation method comprising,
a step for measuring a pressure of the gas of the refrigerant flowing in the pipe,
a step for controlling a flow rate of the gas of the refrigerant in the pipe so as to render the pressure of the gas being measured to be at a predetermined level,
a step for measuring a gas flow rate flowing in the pipe,
a step for obtaining a heat penetration amount into the cryostat based on the gas flow rate being measured, and
a step for calculating the coolability of the cryo-cooler based on the heat penetration amount.

15. A coolability appropriateness judging method of a cryo-cooler in a magnetic resonance imaging apparatus including a superconducting magnet having a cryostat involving a superconducting coil for generating a static magnetic field and a refrigerant to cool the superconducting coil, the cryo-cooler for recondensing the refrigerant being vaporized, a heater for applying desired heat to the cryostat, and a pipe for discharging gas of the refrigerant from the cryostat, the coolability appropriateness judging method comprising;
(a) a step for measuring a pressure of the gas of the refrigerant flowing in the pipe,
(b) a step for controlling a flow rate of the gas of the refrigerant within the pipe so that the gas pressure being measured is rendered to be at a predetermined level,
(c) a step for measuring a gas flow rate flowing in the pipe,
(d) a step for obtaining a deteriorated amount of coolability of the cryo-cooler, based on the gas flow rate being measured,
(e) a step for controlling a heating value of the heater in association with the deteriorated amount of the coolability of the cryo-cooler, and
(f) a step for deciding whether or not the coolability of the cryo-cooler is appropriate based on the heating value.

16. The coolability appropriateness judging method according to claim 15, further comprising,
a step for repeating the steps (a) to (f) at regular intervals, after the step (f) is performed.

17. The coolability appropriateness judging method according to claim 15, wherein,
each of the steps is executed while imaging a test subject, by applying at least one of a gradient magnetic field and an RF magnetic field.

18. A remote monitoring support system of a magnetic resonance imaging apparatus, comprising the magnetic resonance imaging apparatus according to claim 4, and a remote monitoring apparatus connected to the magnetic resonance imaging apparatus via a communication controller, wherein,
the remote monitoring apparatus comprises a presenting unit for presenting information transmitted from the magnetic resonance imaging apparatus, and
an information item notified by the notifying unit and an information item outputted from the gas flow rate outputting unit are transmitted to the remote monitoring apparatus.

19. An installation support method of a magnetic resonance imaging apparatus comprising a superconducting magnet having a cryostat involving a superconducting coil for generating a static magnetic field and a refrigerant to cool the superconducting coil, a cryo-cooler being incorporated in the cryostat for recondensing the refrigerant being vaporized, and a gas flow measuring device being connected to a pipe for discharging gas of the refrigerant to the outside, for controlling a gas flow rate flowing in the pipe to be at a constant pressure to measure the gas flow rate, the installation support method comprising,
a heat penetration amount calculation step for calculating a heat penetration amount into the cryostat based on the gas flow rate measured by the gas flow measuring device,
a coolability calculation step for calculating the coolability of the cryo-cooler by using the heat penetration amount,
a determination step for determining whether or not the heat penetration amount and the coolability respectively calculated by the heat penetration amount calculation step and the coolability calculation step are within allowable ranges being predetermined, and
a presenting step for presenting a result of the determination to an operator.

20. An operation monitoring support method in a magnetic resonance imaging apparatus including a superconducting magnet having a cryostat involving a superconducting coil for generating a static magnetic field and a refrigerant to cool the superconducting coil, a cryo-cooler being incorporated in the cryostat for recondensing the refrigerant being vaporized, and a gas flow measuring device being connected to a pipe for discharging gas of the refrigerant to the outside, for controlling a gas flow rate flowing in the pipe to be at a constant pressure to measure the gas flow rate, the operation monitoring support method comprising,
   1) a heat penetration amount calculation step for calculating a heat penetration amount into the cryostat based on the gas flow rate measured by the gas flow measuring device,
   2) a coolability calculation step for calculating the coolability of the cryo-cooler by using the heat penetration amount,
   3) a status determination step for calculating an allowance obtained by subtracting the heat penetration amount calculated in the heat penetration amount calculation step, from the coolability calculated in the coolability calculation step, and for determining based on the allowance, whether or not the coolability of the cryo-cooler is sufficient, and
   4) a presenting step for presenting to an operator, a result of the determination and the allowance obtained in the status determination step.

21. The operation monitoring support method according to claim 20, further comprising,
   5) a record holding step for holding the heat penetration amount and the coolability respectively calculated by the heat penetration amount calculation step and the coolability calculation step, in association with each clock time of the calculations, wherein, the steps 1) to 5) in series are performed at regular intervals, and in the presenting step, the information held in the record holding step is also presented.

22. A remote monitoring support method in a magnetic resonance imaging apparatus monitoring system comprising a magnetic resonance imaging apparatus including a superconducting magnet having a cryostat involving a superconducting coil for generating a static magnetic field and a refrigerant to cool the superconducting coil, a cryo-cooler being incorporated in the cryostat for recondensing the refrigerant being vaporized, and a gas flow measuring device being connected to a pipe for discharging gas of the refrigerant to the outside, for controlling a gas flow rate flowing in the pipe to be at a constant pressure to measure the gas flow rate, and a remote monitor connected to the magnetic resonance apparatus via a communication controller, the remote monitoring support method comprising,
   a heat penetration amount calculation step for calculating a heat penetration amount into the cryostat based on the gas flow rate measured by the gas flow measuring device,
   a coolability calculation step for calculating coolability of the cryo-cooler by using the heat penetration amount,
   an allowance calculation step for calculating an allowance obtained by subtracting the heat penetration amount calculated in the heat penetration amount calculation step, from the coolability calculated in the coolability calculation step,
   a transmission step for transmitting the allowance to the remote monitor, and
   a presenting step for presenting the allowance received in the remote monitor to an operator.

* * * * *